(12) United States Patent
Strachan et al.

(10) Patent No.: US 11,551,771 B2
(45) Date of Patent: Jan. 10, 2023

(54) ANALOG CONTENT ADDRESSABLE MEMORY FOR STORING AND SEARCHING ARBITRARY SEGMENTS OF RANGES

(71) Applicant: HEWLETT PACKARD ENTERPRISE DEVELOPMENT LP, Houston, TX (US)

(72) Inventors: John Paul Strachan, Milpitas, CA (US); Can Li, Palo Alto, CA (US); Catherine Graves, Milpitas, CA (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 0 days.

(21) Appl. No.: 17/326,223

(22) Filed: May 20, 2021

(65) Prior Publication Data
US 2022/0375536 A1    Nov. 24, 2022

(51) Int. Cl.
G11C 15/04    (2006.01)
G11C 27/00    (2006.01)

(52) U.S. Cl.
CPC .......... G11C 27/005 (2013.01); G11C 15/046 (2013.01)

(58) Field of Classification Search
CPC ............................ G11C 27/005; G11C 15/046
USPC .................................................... 365/45, 49.1
See application file for complete search history.

(56) References Cited

U.S. PATENT DOCUMENTS

| 7,035,968 | B1 | 4/2006 | Pereira |
| 7,061,783 | B2 * | 6/2006 | Shin ....................... G11C 15/00 365/240 |
| 7,206,212 | B1 | 4/2007 | Chou |
| 7,852,652 | B1 | 12/2010 | Fabry |
| 8,909,857 | B2 | 12/2014 | Reddy |
| 9,721,661 | B1 * | 8/2017 | Buchanan .............. G11C 15/04 |

(Continued)

OTHER PUBLICATIONS

Gau, M. et al., "Efficient Packet Matching for Gigabit Network Intrusion Detection using ICAMS," Proccedings of the 20th International Conference on Advanced Information Networking & Applications (AINA'06), 2006, 6 pgs., website http://cial.csie.ncku.edu.tw/members/html/ms06/mook/files/[AINA'06]Efficient%20Packet%20Matching%20for%20Gigabit%20Network%20Intrusion%20Detection%20using%20tcam.pdf, IEEE.

(Continued)

Primary Examiner — Son L Mai
(74) Attorney, Agent, or Firm — Sheppard Mullin Richter & Hampton LLP

(57) ABSTRACT

Systems, devices, circuits, methods, and non-transitory computer readable media that enable storing and searching arbitrary segments of ranges of analog values are disclosed. Various analog content addressable memory (aCAM) circuit implementations having the capability to store and search outside of a range of values, within any of multiple disjoint ranges, or outside of multiple ranges are disclosed. The disclosed aCAM circuit implementations make searching for complex input features more flexible and efficient, thereby yielding a technological improvement over conventional solutions. In some implementations, an aCAM may include multiple pull-down transistors connected in series to a match line that is pre-charged, in which case, the aCAM detects a match if the match line is not discharged by the pull-down transistors, which occurs if at least one pull-down transistor is in an OFF state. In other implementations, an aCAM includes pass gates connected to a match line to detect a match.

18 Claims, 12 Drawing Sheets

(56) References Cited

U.S. PATENT DOCUMENTS

| | | | |
|---|---|---|---|
| 10,340,007 B2* | 7/2019 | Salama | G11C 15/046 |
| 10,847,238 B2* | 11/2020 | Li | G11C 7/1006 |
| 10,998,047 B1* | 5/2021 | Li | G11C 15/00 |
| 11,289,162 B2* | 3/2022 | Strachan | G11C 27/00 |
| 2002/0007446 A1 | 1/2002 | Stark | |

OTHER PUBLICATIONS

Louri, A., "Optical Content-addressable Parallel Processor: Architecture, Algorithms, and Design Concepts," Applied Optics, Jun. 10, 1992, pp. 3241-3258, vol. 31, Issue 17, website https://uweb.engr.arizona.edu/~hpcat/papers/ao_06_1992.pdf.

* cited by examiner

ANALOG CONTENT ADDRESSABLE MEMORY FOR STORING AND SEARCHING ARBITRARY SEGMENTS OF RANGES

DESCRIPTION OF RELATED ART

A variety of application scenarios rely on the ability to search arbitrary segments of ranges such as, for example, outside of a particular range. Such scenarios include, for instance, access control lists, network routing, and random forests/decision trees. For instance, in the case of Internet Protocol (IP) address mapping, it may be necessary to determine whether an IP address is outside of a segment of the IP address space that is not available for use.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

Figure 1:
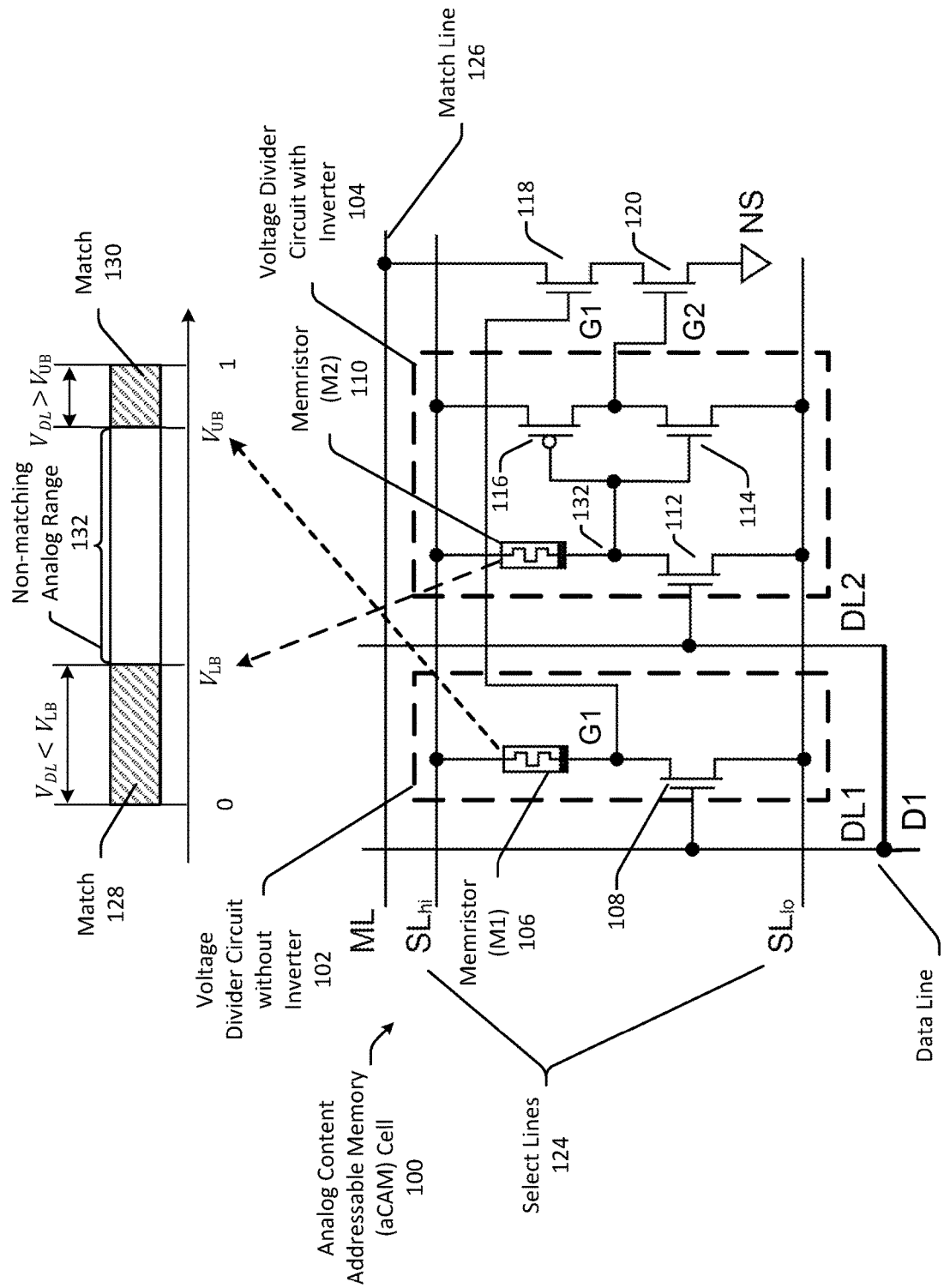
FIG. 1 depicts an analog content addressable memory (aCAM) circuit implementation that encodes and enables searching outside of a range of analog values according to some embodiments.

The figures are not exhaustive and do not limit the present disclosure to the precise form disclosed.

DETAILED DESCRIPTION

Example embodiments of the disclosed technology relate to systems, devices, circuits, methods, and non-transitory computer readable media that enable storing and searching arbitrary segments of ranges of analog values. In particular, some embodiments of the disclosed technology relate to an analog content addressable memory (aCAM) circuit having the capability to store and search segments of analog value ranges. For instance, aCAM circuit implementations disclosed herein can be utilized to determine whether an input value falls outside of a particular range of values, whether an input value falls within any of multiple disjoint ranges, or conversely, outside of multiple ranges, and so forth. As such, aCAM circuit implementations according to embodiments of the disclosed technology make searching for complex input features more flexible and efficient, and as a result, yield a technological improvement over conventional solutions. The aCAM circuit implementations disclosed herein have applicability across a wide range of application contexts including in connection with access control lists, network routing, decision trees, and the like. In addition, in some embodiments, the Boolean logic underpinning an aCAM circuit implementation allows for efficient k-SAT problem solving using the aCAM circuit, thereby providing another technological improvement over conventional solutions.

Generally speaking, a CAM receives an input search word which it then compares against words stored in the CAM to identify any stored word(s) that match the search word. If the CAM locates a matching stored word, the CAM may return the address of the stored word in the CAM. In a typical CAM implementation, the search word includes n bits, with each bit being provided as input to the CAM along a corresponding search line. The CAM then performs a parallel search that includes comparing the search word to each of the stored words in parallel. Any stored word that matches the search word may be identified based on the voltage observed on a corresponding match line. For instance, each match line may be pre-charged to a high voltage, which is then discharged if the corresponding stored word does not match the search word. Any match line that remains at high voltage indicates a match.

A particular type of CAM is a ternary CAM, also referred to as a TCAM. A TCAM may be implemented in volatile memory such as static random access memory (SRAM) and stores the ternary information in two binary memory cells that together are capable of representing a ternary bit capable of taking on any of three values: 0, 1, or a "don't care" value. A stored word that includes a "don't care" value at a particular bit position will output a match at that bit position regardless of the value of the search word at that position. Similarly, each bit of the search word may take on a 0, 1, or a "don't care" value. A "don't care" value specified at a particular bit position in the search query matches against any value that may be stored in the TCAM at that position. Thus, a TCAM enables flexible search queries by permitting a "don't care" value to be both stored and searched.

An aCAM, such as any of those described in commonly-owned U.S. Application Ser. No. 16/274,379 (now U.S. Pat. No. 10,847,238), Ser. No. 16/744,136, or 16/526,455 (now U.S. Pat. No. 10,896,731), may include a series of cells arranged in an array of rows and columns. In example embodiments, a respective one or more cells of the aCAM may be used to represent a stored value or a stored range of values for each search parameter/variable. An example existing aCAM circuit implementation, such as that described in commonly-owned U.S. application Ser. No. 17/085,805, includes a collection of transistors and 2 memristors. Respective conductances of the memristors are tuned to represent lower and upper voltage bounds of a matching analog voltage range for the aCAM cell. A voltage applied to a data line is received at an aCAM cell, and a match result is outputted if the data line voltage is within the analog voltage range defined by the respective memristor conductances. In this manner, the aCAM cell is able to store/search a particular analog range of values because any value contained within the range of values would correspond to a data line voltage that falls within a corresponding analog voltage range established by the aCAM cell. Further, because an aCAM enables flexible searching, it is also a TCAM.

The aforementioned aCAM circuit implementation natively maps tree structures (as described in U.S. application Ser. No. 17/085,805) and implements the random forests algorithm or any ensemble tree-based model in near constant-time operation. This is achieved by reformulating a decision tree for implementation within the aCAM by: 1) representing each root-to-leaf path in the decision tree as a node chain containing a series of nodes, 2) combining multiple evaluable conditions associated with a given individual feature into a single node (e.g., combining a first node that evaluates whether $f_1 > x_1$ with a second node that evaluates whether $f_1 < x_2$), 3) adding a flexible "don't care" node for each feature that is not evaluated in the node chain, and 4) rotating each modified node chain representation and mapping it to a respective row in the aCAM array, where each column in the aCAM array represents a feature vector for a given feature variable. Classification results corresponding to the aCAM rows can be stored in a directly connected memory array. Because the aCAM cells can store analog values and ranges, multiple evaluable conditions for a given feature node can be implemented in a single cell.

Existing aCAM circuit implementations such as those described above provide the capability to efficiently store and search a range between two values, e.g., determine whether an input value falls within a stored range of analog values. They do not, however, provide the capability to efficiently store and search arbitrary range segments, e.g., determine, for an input feature value $f_1$, whether $f_1 < x_1$ or $f_1 > x_2$, where $x_2 > x_1$. That is, using an existing aCAM circuit implementation to encode arbitrary segments of ranges of analog values would require so much area that searching such structures would be highly inefficient. In particular, enabling searching outside of a range entails encoding the complement of the range within the aCAM. Because the complement of the range includes the universe of all potential values that fall outside of the range, the amount of area (e.g., the aCAM array size) needed to encode this universe of potential values is substantial. Moreover, using a conventional SRAM CAM implementation would require even more area.

This technical problem is solved by embodiments of the disclosed technology that include aCAM circuit implementations that enable searching arbitrary segments of ranges of analog values in a highly flexible and efficient manner. For example, aCAM circuit implementations according to embodiments of the disclosed technology are capable of implementing searching outside of a range or searching multiple range segments within a single aCAM cell. As such, embodiments of the disclosed technology provide a technical solution that significantly reduces the circuit complexity, and correspondingly, significantly increases the efficiency of searching arbitrary segments of ranges of analog values.

Referring now to FIG. 1, an aCAM circuit implementation that enables searching outside of a range of analog values according to some embodiments is depicted. Rather than being implemented using volatile memory such as SRAM, the aCAM cell 100 depicted in FIG. 1 is implemented using non-volatile components such as tunable resistance devices 106, 110. In some embodiments, the tunable resistance devices 106, 110 are memristors and will be described as such hereinafter for ease of explanation. In the example implementation depicted in FIG. 1, the aCAM cell 100 includes six transistors 108, 112, 114, 116, 118, 120 and two memristors (M1 106 and M2 110). The transistors may include various combinations of n-type and p-type transistors including n-type metal oxide semiconductor (MOS) field-effect transistors (MOSFETs), p-type MOSFETs, and the like. It should be appreciated, however, that other types/combinations of transistors/semiconductor materials may be employed.

The aCAM cell 100 may constitute a unit element of an aCAM circuit that may include multiple such cells arranged in an array of rows and columns. The aCAM cell 100 includes select lines 124 ($SL_{hi}$ and $SL_{lo}$), a match line 126, and a data line 122. The aCAM cell 100 further includes a voltage divider circuit 102 that includes memristor 106 (M1) and transistor 108 connected in series and a voltage divider circuit 104 that includes memristor 110 (M2) and transistor 112 connected in series. Each memristor 106, 110 is connected to one of the select lines 124 ($SL_{hi}$) and each transistor 108, 112 is connected to the other select line 124 ($SL_{lo}$). The voltage divider circuit 104 differs from the voltage divider circuit 102 in that it also includes an inverter formed by transistors 114 and 116 connected in series.

The aCAM cell additionally includes pull-down transistors 118, 120 connected in series. Voltage G1 corresponds to the gate voltage at transistor 118 and voltage G2 corresponds to the gate voltage at transistor 120. In some embodiments, respective voltages are applied to the select lines 124 to activate the aCAM cell 100, or more specifically, the aCAM row containing the aCAM cell 100. The select lines 124 provide a voltage drop across the voltage divider circuit 102. The resistance across transistor 108 determines, at least in part, the voltage G1, which in turn, determines the gate voltage at pull-down transistor 118. Along similar lines, the resistance across transistor 112 determines, at least in part, the gate voltage G2 at transistor 120. In some embodiments, the match line 126 is pre-charged to a high voltage and is only discharged if the respective gate voltages of pull-down transistors 118, 120 are each greater than their respective threshold voltages so as to cause the transistors 118, 120 to both transition to a low resistance state (i.e., turn ON) and discharge the match line 126.

In example embodiments, the aCAM cell 100 may be one of several aCAM cells in a same row of an aCAM. The aCAM cell 100 and each other aCAM cell in the same row may be connected to the match line 126. Similarly, each other row in the aCAM may be connected to a respective match line. Each row of an aCAM may correspond to a stored word against which a search word is evaluated to determine if a match exists. In example embodiments, the search operation may begin by pre-charging each aCAM row's respective match line to a high logic level (e.g., a high voltage). A match line (e.g., the match line 126) remains at the high voltage (which indicates a match) only if all of the aCAM cells in the aCAM row connected to that match line yield a match for their corresponding inputs. That is, if one search input value does not match data stored in a corresponding aCAM cell, that cell will discharge the match line to which it is connected and lead to a non-match even if every other cell in the same row yields a match.

In some embodiments, an input search variable is mapped to a voltage amplitude $V_{DL}$ that is applied on the data line 122. The data line 122 may also be connected to each other aCAM cell in a same column in the aCAM array as the aCAM cell 100. More specifically, each column of cells in the aCAM may store data relating to a respective input search variable, with some search variables corresponding to multiple aCAM columns if greater bit precision is required. The voltage $V_{DL}$ on the data line 122 is split into voltages $V_{DL1}$ and $V_{DL2}$ and fed to the voltage divider circuits 102, 104, respectively. As will be described in more detail later in this disclosure, in some embodiments, if the input voltage $V_{DL}$ on the data line 122 corresponds to an input value that falls outside of a given range of analog values (e.g., above an upper bound of the range or below a lower bound of the range), then one of the voltages G1 or G2 will remain low causing a corresponding pull-down transistor to remain in a high resistance state (OFF). The result is that the match line 126 is kept high and not discharged, thereby yielding a match result.

In some embodiments, respective programmed conductances GM and GM of the memristors 106, 110 may be tuned to establish an upper voltage bound $V_{UB}$ and a lower voltage bound $V_{LB}$, respectively, of a non-matching range of analog values 132. Then, based on its circuit structure, the aCAM cell 100 encodes and enables the searching of outside of the range 132. More specifically, the upper voltage bound $V_{UB}$ enforced by the aCAM cell 100 may be a function of the conductance $G_{M1}$ of the memristor 106 (i.e., $V_{UB}=f(G_{M1})$) and the lower voltage bound $V_{LB}$ may be a function of the conductance Gm of the memristor 110 (i.e., $V_{LB}=f(G_{M2})$). More specifically, in some embodiments, $V_{UB}$ may be a function of $G_{M1}$ and a threshold voltage of transistor 108. Similarly, $V_{LB}$ may be a function of Gm and a threshold voltage of transistor 112.

It should be appreciated that the upper voltage bound $V_{UB}$ of the aCAM cell 100 refers to a voltage threshold that serves as the upper bound of the non-matching range of analog values 132 such that a $V_{DL}>V_{UB}$ would fall outside of the non-matching range 132 and result in a match 130. Similarly, it should be appreciated that the lower voltage bound of the $V_{LB}$ of the aCAM cell 100 refers to a voltage threshold that serves as the lower bound of the non-matching range of analog values 132 such that a $V_{DL}<V_{LB}$ would likewise fall outside of the non-matching range 132 and result in a match 128. Thus, the aCAM cell 100 produces a match if the following Boolean OR statement is TRUE: $V_{DL}<V_{LB}$ OR $V_{DL}>V_{UB}$.

Referring now to the operation of the aCAM cell 100 in more detail, assume that a $V_{DL}<V_{LB}$ is applied on the data line 122. The operation of voltage divider circuit 104 is of particular interest in this example scenario. As previously noted, $V_{DL}$ is split into $V_{DL1}$ and $V_{DL2}$, resulting in a relatively low gate voltage at transistor 112. The effective conductance of transistor 112 is therefore low (i.e., a high resistance state) as compared to the memristor 110, which results in a relatively large voltage drop across the transistor 112. As a result, the node 132 above transistor 112 is at high voltage. This high voltage signal is then inverted to produce a low gate voltage G2 at pull-down transistor 120. The gate voltage G2 in this scenario is insufficient to overcome the threshold voltage of transistor 120 and it remains OFF. Thus, the discharge path for the match line 126 remains closed and the match line 126 is not discharged, which as noted earlier, corresponds to a match.

It should be noted that in this scenario in which $V_{DL}$ is less than $V_{LB}$, the match line 126 is not discharged regardless of what the voltage G1 is. More specifically, a low $V_{DL1}$ (e.g., $V_{DL}<V_{LB}$) results in a low gate voltage at transistor 108, which translates to a low effective conductance for transistor 108 as compared to the memristor 106 and a large voltage drop across the transistor 108. As a result, the voltage at the node above the transistor 108 is high, and correspondingly, the gate voltage G1 at the pull-down transistor 118 is high, causing it to turn ON. This, however, fails to discharge the match line 126 because the pull-down transistor 120 remains OFF. Thus, $V_{DL}$ being less than $V_{LB}$ results in a match for the aCAM cell 100 based on the operation of voltage divider circuit 104 regardless of what happens with voltage divider circuit 102. In this manner, operation of the voltage divider circuit 104 controls/enforces the outside-of-range search with respect to the lower bound $V_{LB}$ of the range 132.

Assume now, on the other hand, that a $V_{DL}>V_{UB}$ is applied on the data line 122. The operation of voltage divider circuit 102 is of particular interest in this example scenario. As previously noted, $V_{DL}$ is split into $V_{DL1}$ and $V_{DL2}$, resulting in a relatively high gate voltage at transistor 108. The effective conductance of transistor 108 is therefore high (i.e., a low resistance state) as compared to the memristor 106, which results in a relatively large voltage drop across the memristor 106. As a result, the voltage at the node above transistor 108 and below the memristor 106 is low, producing a correspondingly low gate voltage G1 at pull-down transistor 118. This low gate voltage is insufficient to overcome the threshold voltage of transistor 118, causing it to remain OFF. Thus, the discharge path for the match line 126 remains closed and the match line 126 is not discharged, which as noted earlier, corresponds to a match.

It should be noted that in this scenario in which $V_{DL}$ is greater than $V_{UB}$, the match line 126 is not discharged regardless of what the voltage G2 is. More specifically, a high $V_{DL2}$ (e.g., $V_{DL}>V_{UB}$) results in a high gate voltage at transistor 112, which translates to a high effective conductance of transistor 112 as compared to the memristor 110 and thus a large voltage drop across the memristor 110. As a result, the voltage at the node 132 above the transistor 112 and below the memristor 110 is low, which when inverted, results in a high gate voltage G2 applied to transistor 120, causing it to turn ON. This, however, fails to discharge the match line 126 because the pull-down transistor 118 remains OFF. Thus, $V_{DL}$ being greater than $V_{UB}$ results in a match for the aCAM cell 100 based on the operation of voltage divider circuit 102 regardless of what happens with voltage divider circuit 104. In this manner, operation of the voltage divider circuit 102 controls/enforces the outside-of-range search with respect to the upper bound $V_{UB}$ of the range 132.

Assume now that a $V_{DL}$ that is within the non-matching analog range 132 defined by $V_{LB}$ and $V_{UB}$ (i.e., $V_{LB}<V_{DL}<V_{UB}$) is applied on the data line 122. As previously noted, $V_{DL}$ is split into $V_{DL1}$ and $V_{DL2}$, where $V_{DL1}$ is supplied to the transistor 108 and $V_{DL2}$ is supplied to the transistor 112. In this example scenario, $V_{DL1}$ is not sufficient to overcome the threshold voltage of transistor 108, resulting in a low effective conductance (i.e., high resistance state) for the transistor 108 as compared to the memristor 106, and causing a large voltage drop across the transistor 108. As such, a high voltage occurs at the node between the memristor 106 and the transistor 108, which corresponds to a high gate voltage G1 at pull-down transistor 118. This causes the transistor 118 to turn ON.

In addition, $V_{DL2}$ is sufficient to overcome the threshold voltage of transistor 112, resulting in a high effective conductance (i.e., low resistance state) for the transistor 112 as compared to the memristor 110, and causing a large voltage drop across the memristor 110 and resulting in a low voltage at node 132. The low voltage at node 132 is inverted, resulting in a high gate voltage G2 at pull-down transistor 120. This causes the transistor 120 to turn ON. With both pull-down transistors 118, 120 turned ON, the match line 126 is discharged and a non-match is detected. Thus, because any input voltage $V_{DL}$ that lies within the range 132 defined by $V_{LB}$ and $V_{UB}$ (i.e., $V_{LB} \leq V_{DL}<V_{UB}$) results in a non-match, and any input voltage $V_{DL}$ that lies outside of the range 132 (i.e., $V_{DL}<V_{LB}$ or $V_{DL}>V_{UB}$) results in a match, the aCAM cell 100 encodes and enables searching outside of a range of analog values (i.e., non-matching range 132).

In some embodiments, the non-matching analog range 132 may be inclusive of $V_{LB}$ and $V_{UB}$, meaning that an input data line voltage $V_{DL}$ that equals $V_{LB}$ or that equals $V_{UB}$ falls within the non-matching range 132 and results in a non-match. In such embodiments, the non-matching range 132 would be given by $V_{LB} \leq V_{DL} \leq V_{UB}$. In other embodiments, one or both of $V_{LB}$ or $V_{UB}$ may lie outside the non-matching range 132 such that $V_{DL}=V_{LB}$ or $V_{DL}=V_{UB}$ would result in a match. More generally, it should be appreciated that for any matching or non-matching analog range segment disclosed herein, a lower voltage bound and/or an upper voltage bound defining the range segment may lie within the range segment or outside of it, depending on the implementation.

In some embodiments, a "don't care" value is encoded in the aCAM cell 100 by tuning the respective conductances $G_{M1}$ and $GM$ of memristors 106, 110 to establish a matching voltage range for the cell 100 that is bounded by a lower voltage bound $V_{LB}<V_{DL,min}$ and an upper voltage bound $V_{UB}<V_{DL,max}$. In this manner, any data line voltage supplied to the aCAM cell 100—which must be between $V_{DL,min}$ and $V_{DL,max}$—would necessarily also fall between the lower and upper voltage bounds. Thus, any input search value would result in a match. In addition to being able to store a don't care value, the aCAM cell 100 may also be configured to support receiving a don't care value for a search input value. For instance, a don't care value can be searched by supplying, for example, an input voltage $V_{DL}$ that corresponds to $V_{DL,min}$ or $V_{DL,max}$, which in turn, would result in one of the pull-down transistors 118, 120 remaining in an OFF state, thereby prevent discharge of the match line 126. In addition, in some example embodiments, the aCAM cell 100 may be configured to force a mismatch for a stored word by tuning the respective conductances $G_{M2}$ and $G_{M2}$ of memristors 106, 110 such that $f(G_{M1})>f(G_{M2})$. In this example scenario, the aCAM cell 100 would produce a mismatch (thereby resulting in a mismatch for an entire stored word in the row of the an aCAM that includes the cell 100) regardless of the search input value received at the cell 100.

Figure 2A:
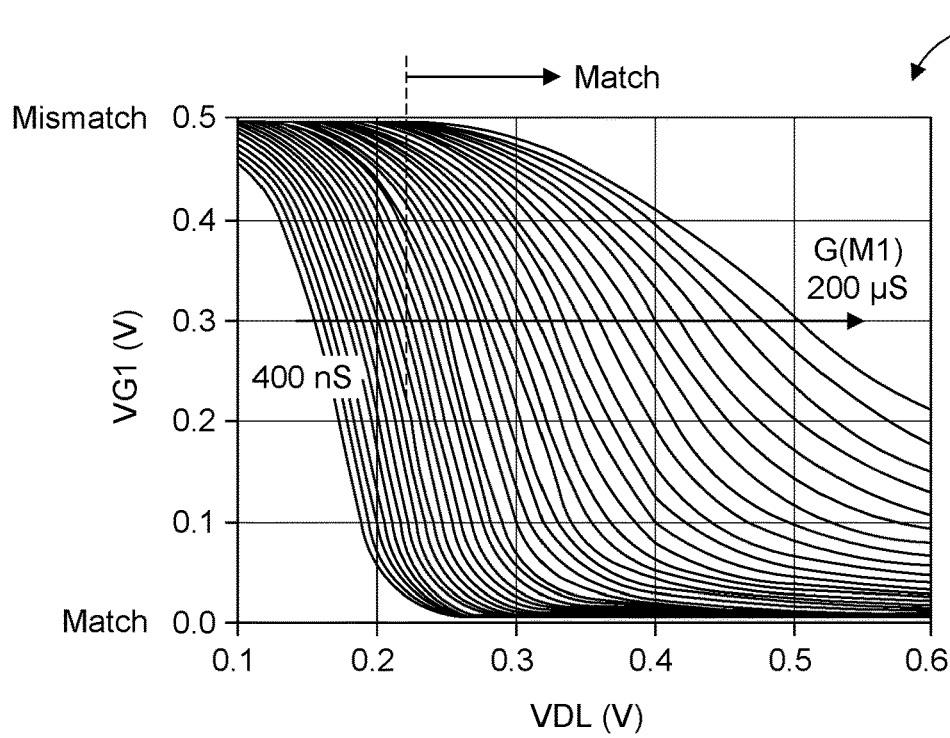
FIG. 2A is a voltage diagram depicting the matching of an input voltage above an upper bound by a non-inverting voltage divider circuit of the aCAM circuit of FIG. 1 according to some embodiments.

FIG. 2A depicts a voltage diagram 200A that illustrates the matching of an input voltage above an upper bound by the non-inverting voltage divider circuit 102 of the aCAM cell 100 depicted in FIG. 1. As shown in the voltage diagram 200A, assuming memristor 106 (M1) is tuned to a given conductance establishing an upper bound of a non-matching analog range of the aCAM cell 100, input voltages $V_{DL}$ above a threshold indicated by the dashed line would result in a voltage G1 that is not sufficient to turn ON the pull-down transistor 118, thereby preventing the match line 126 from being discharged and resulting in a match.

Figure 2B:
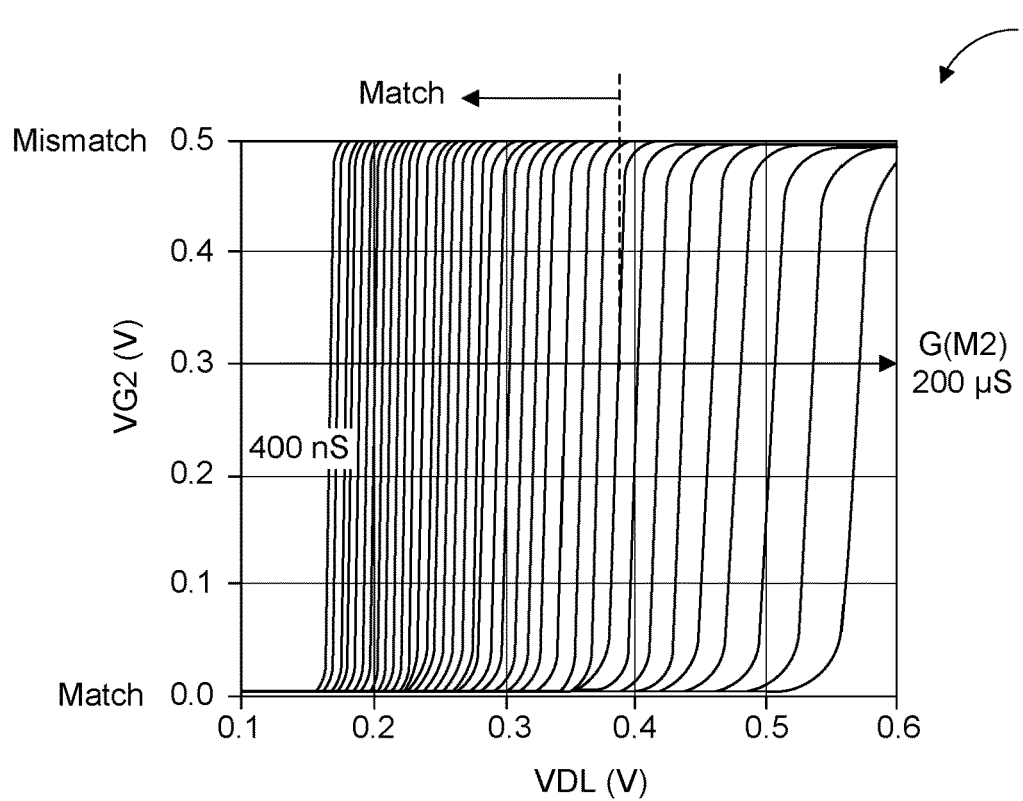
FIG. 2B is a voltage diagram depicting the matching of an input voltage below a lower bound by an inverting voltage divider circuit of the aCAM circuit of FIG. according to some embodiments.

FIG. 2B depicts a voltage diagram 200B illustrating the matching of an input voltage below a lower bound by the inverting voltage divider circuit 104 of the aCAM cell 100 depicted in FIG. 1. As shown in the voltage diagram 200B, assuming memristor 110 (M2) is tuned to a given conductance establishing a lower bound of a non-matching analog range, input voltages $V_{DL}$ below a threshold indicated by the dashed line would result in a voltage G2 that is not sufficient to turn ON the pull-down transistor 120, thereby preventing the match line 126 from being discharged and resulting in a match. It should be appreciated that voltage diagrams 200A and 200B individually illustrate the functionality of the non-inverting voltage divider circuit 102 and the inverting voltage divider circuit 104, respectively, of the aCAM cell 100, but do not collectively represent searching outside of the non-matching range 132. To represent searching outside of the specific range 132 depicted in FIG. 1, the lower and upper voltage bounds would be modified.

Figure 3:
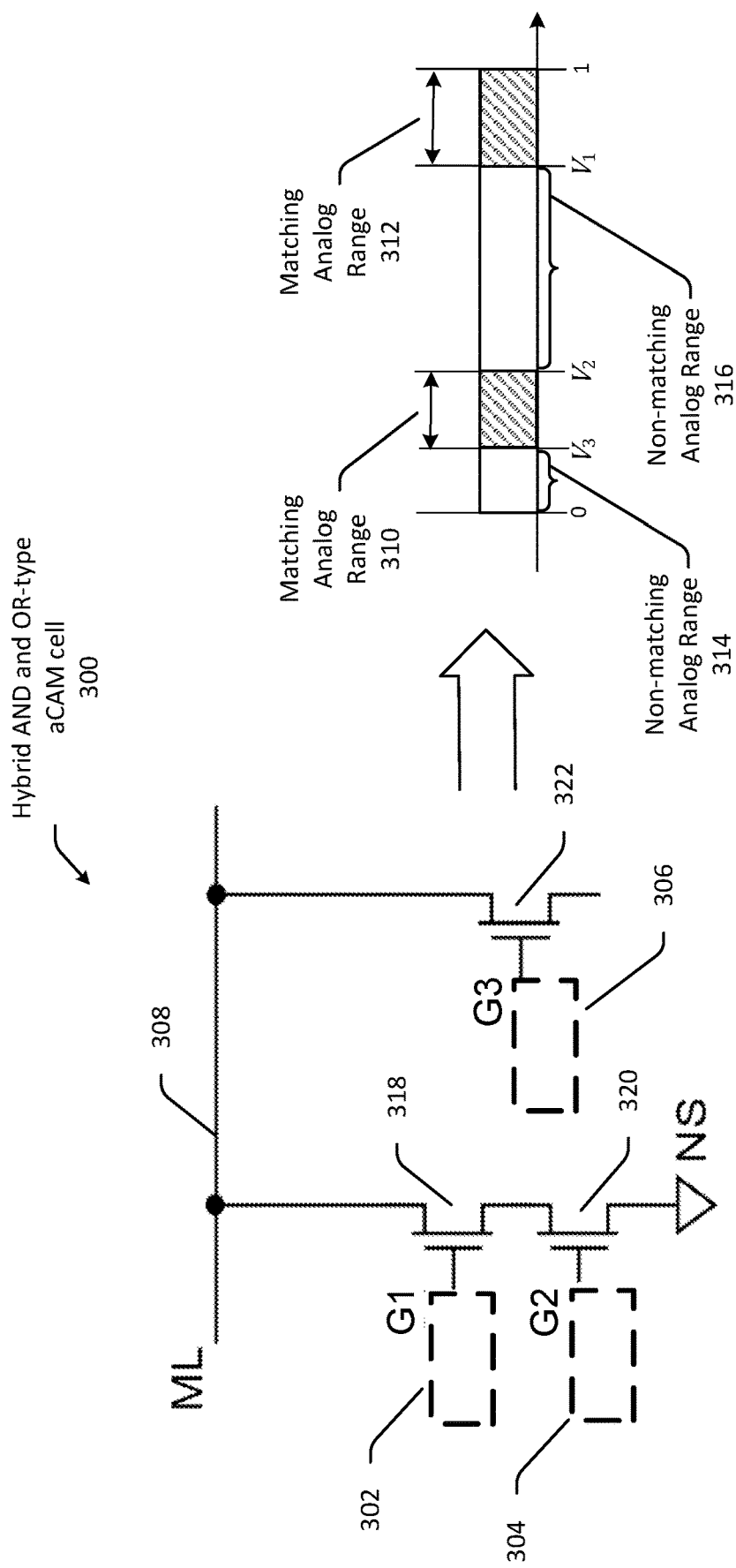
FIG. 3 depicts a hybrid AND and OR-type aCAM cell that encodes and enables searching multiple disjoint ranges of analog values according to some embodiments.

FIG. 3 depicts a hybrid AND and OR-type aCAM cell 300 that enables searching multiple disjoint analog ranges, or stated another way, searching outside of multiple disjoint ranges. The aCAM cell 300 includes various circuit sub-units 302, 304, 306. In some embodiments, the sub-unit 302 may have the same structure as the voltage divider circuit 102 of aCAM cell 100 (FIG. 1) and the sub-unit 304 may have the same structure as the voltage divider circuit 104 that includes the inverter. The sub-units 302, 304 are respectively connected to pull-down transistors 318, 320, which in turn, are connected in series to a match line 308. Thus, the combination of the sub-units 302 and 304 and the pull-down transistors 318, 320 is similar in structure to the aCAM cell 100.

The sub-unit 306 may be an additional voltage divider circuit having the same structure as the sub-unit 302. The sub-unit 306 is connected to a pull-down transistor 322, which in turn, is connected to the match line 308 in parallel with the combination of pull-down transistors 318, 320. The sub-units 302, 304, 306 will be referred to hereinafter as voltage divider circuits 302, 304, 306, respectively, for ease of explanation. The additional voltage divider circuit 306 establishes a new lower bound $V_3$ for the aCAM cell 300 that enables multiple disjoint analog range segments to be searched. In particular, the aCAM cell 300 detects a match if the input voltage $V_{DL}$ is greater than $V_1$, in which case, $V_{DL}$ falls within the matching analog range 312, or if input voltage $V_{DL}$ is greater than $V_3$ and less than $V_2$, in which case, $V_{DL}$ falls within matching analog range 310.

The aCAM cell 300 can also be thought of as enabling searching outside of multiple disjoint non-matching analog ranges 314, 316. That is, for any input voltage $V_{DL}$ that falls within the analog range 314 (i.e., $V_{DL}<V_3$) or for any input voltage $V_{DL}$ that falls within analog range 316 (i.e., $V_2<V_{DL}<V_1$), the match line 308 would be discharged and a non-match would be detected. In contrast, for any input voltage $V_{DL}$ that falls outside of the non-matching ranges 314, 316, the match line 308 would not be discharged and a match would be detected. More specifically, the aCAM cell 300 returns a match if the following Boolean expression is TRUE and does not return a match if the expression is FALSE: (G1 is low OR G2 is low) AND G3 is low. This expression is equivalent to the following expression: ($V_{DL}$>$V_1$ OR $V_{DL}$<$V_2$) AND $V_{DL}$>$V_3$.

Referring now in more detail to the operation of the aCAM cell 300, assume that an input voltage $V_{DL}$ that is less than $V_3$ is supplied to the cell 300. This corresponds to a scenario in which the input voltage $V_{DL}$ falls within the non-matching analog range 314. In this scenario, the gate voltage G1 at pull-down transistor 318 is high, but the gate voltage G2 at pull-down transistor 320 is low. As such, the pull-down transistor 320 remains OFF, the discharge path associated with pull-down transistors 318, 320 is not completed, and the match line 308 is not discharged. The gate voltage G3 at the pull-down transistor 322, however, is also high similar to the gate voltage G1 (since the voltage divider circuit 306 has the same structure as voltage divider circuit 302), and as a result, the pull-down transistor 322 is switched ON, causing the match line 308 to discharge and a match not to be detected.

In particular, in this scenario, the input voltage $V_{DL}$ is not sufficient to overcome the threshold voltage of the transistor 108 of the voltage divider circuit 306. Thus, the transistor 108 has a low effective conductance (high resistance) relative to the memristor 106, resulting in a large voltage drop across the transistor 108, and as such, a high voltage above the transistor 108 (e.g., between the memristor 106 and the transistor 108). This high voltage corresponds to the high gate voltage G3 that switches the pull-down transistor 322 ON. It should be appreciated that this scenario demonstrates how the voltage divider circuit 306 and pull-down transistor 322 enforce the lower voltage bound $V_3$ resulting in a matching range 310 that does not extend all the way to the minimum voltage capable of being stored/searched by the cell 300. That is, in the absence of the voltage divider circuit 306, any input voltage $V_{DL}$<$V_2$ would have resulted in a match, similar to aCAM cell 100.

Assume now that an input voltage $V_{DL}$ that is greater than $V_3$ but less than $V_2$ is supplied to the aCAM cell 300. This corresponds to a scenario in which the input voltage $V_{DL}$ falls within the matching analog range 310. In this scenario, the gate voltage G2 at pull-down transistor 320 is low. As such, the pull-down transistor 320 remains OFF, the discharge path associated with pull-down transistors 318, 320 is not completed (regardless of whether the gate voltage G1 is sufficient to turn pull-down transistor 318 ON), and the match line 308 is not discharged. Further, with respect to the voltage divider circuit 306, the input voltage $V_{DL}$ is sufficient to overcome the threshold voltage of transistor 108, which results in the transistor 108 have a high effective conductance relative to the memristor 106, and thus, a low voltage at the node between the memristor 106 and the transistor 108. This low voltage corresponds to a low gate voltage G3 at the pull-down transistor 322, which is insufficient to turn the transistor 322 ON. As a result, the pull-down transistor 322 does not discharge the match line 308. Thus, in this scenario, the discharge path associated with in-series pull-down transistors 318, 320 remains closed because transistor 320 remains OFF and the discharge path associated with pull-down transistor 322 also remains closed because transistor 322 remains OFF. As a result, the match line 308 is not discharged by either of the parallel discharge paths, causing the aCAM cell 300 to return a match.

Assume now that an input voltage $V_{DL}$ that is greater than $V_2$ but less than $V_1$ is supplied to the aCAM cell 300. This corresponds to a scenario in which the input voltage $V_{DL}$ falls within the non-matching analog range 316. In this scenario, $V_{DL}$ is not sufficient to overcome the threshold voltage of transistor 108 of the voltage divider circuit 302, which results in the transistor 108 having a low effective conductance relative to the memristor 106, and thus, a high voltage at the node between the memristor 106 and the transistor 108. This high voltage at the node corresponds to a high gate voltage G1 at the pull-down transistor 318, causing the transistor 318 to switch ON. Moreover, the input voltage $V_{DL}$ is sufficient to overcome the threshold voltage of transistor 112 of the voltage divider circuit 304, which results in the transistor 112 having a high effective conductance relative to the memristor 110, and thus, a low voltage at the node 132 between the memristor 110 and the transistor 112. This low voltage at the node 132 is then inverted to obtain a high gate voltage G2 at the pull-down transistor 320, causing the transistor 320 to switch ON. With both in-series pull-down transistors 318, 320 being ON, the discharge path is completed and the match line 308 is discharged, resulting in a non-match.

It should be appreciated that in the scenario described immediately above the match line 308 is discharged regardless of what occurs with the parallel discharge path associated with the pull-down transistor 322. That is, the match line 308 is discharged based on the discharge path associated with the in-series pull-down transistors 318, 320 being open regardless of whether the parallel discharge path associated with the pull-down transistor 322 is closed. For instance, the input voltage $V_{DL}$ may be sufficient to turn transistor 108 of the voltage divider circuit 306 ON, thereby resulting in a low voltage at the node between the memristor 106 and the transistor 108, and consequently, a low gate voltage G3 at the pull-down transistor 322. The low gate voltage G3 causes the transistor 322 to remain OFF and the associated discharge path to remain closed. This, however, is irrelevant in this scenario because only one of the parallel discharge paths needs to be open to discharge the match line 308 and generate a non-match result.

Assume now that an input voltage $V_{DL}$ that is greater than $V_1$ is supplied to the aCAM cell 300. This corresponds to a scenario in which the input voltage $V_{DL}$ falls within the matching analog range 312. In this scenario, $V_{DL}$ is sufficient to overcome the threshold voltage of transistor 108 of the voltage divider circuit 302, which results in the transistor 108 having a high effective conductance relative to the memristor 106, and thus, a large voltage drop across the memristor 106 and a low voltage at the node between the memristor 106 and the transistor 108. This low voltage at the node corresponds to a low gate voltage G1 at the pull-down transistor 318, causing the transistor 318 to remain OFF. Thus, even if the pull-down transistor 320 associated with the voltage divider circuit 304 is switched ON, because it is provided in-series with the pull-down transistor 318 (which remains OFF), the discharge path is not completed, and the match line 308 is not discharged. In addition, similar to the voltage divider circuit 302, the input voltage $V_{DL}$ is sufficient to overcome the threshold voltage of transistor 108 of the voltage divider circuit 306, which results in the transistor 108 having a high effective conductance relative to the memristor 106, and thus, a large voltage drop across the memristor 106 and a low voltage at the node between the memristor 106 and the transistor 108 of the voltage divider circuit 306. This low voltage corresponds to a low gate voltage G3 at the pull-down transistor 322, causing the transistor 320 to remain OFF. As a result, the discharge path associated with the pull-down transistor 322 remains closed, and the match line 308 is not discharged. Thus, in this scenario, both parallel discharge paths remain closed and the match line 308 is not discharged, resulting in a detected match.

It should be appreciated that aCAM cell 300 is an illustrative implementation for enabling searching of multiple segments of analog values. In particular, the specific aCAM cell 300 implementation is configured to search two disjoint analog ranges 310, 312. However, the combination of AND and OR logic embodied in the aCAM cell 300 can be extended to cover any arbitrary number of segments of analog ranges. For instance, an additional voltage divider circuit with inverter 104 (similar to the voltage divider circuit 304) and associated pull-down transistor may be added in series with the voltage divider circuit 306 and in parallel with the combination of voltage divider circuits 302 and 304. This additional voltage divider circuit and associated pull-down transistor may enforce a new upper bound that is greater than $V_1$ but less than the maximum voltage storable/searchable by the cell 300. More generally, one or more additional voltage divider circuits (e.g., voltage divider circuit 102 and/or voltage divider circuit 104) may be provided in series and/or in parallel with the voltage divider circuits 302, 304, 306 to generate aCAM cells capable of searching any desired arbitrary combination of analog range segments.

Figure 4:
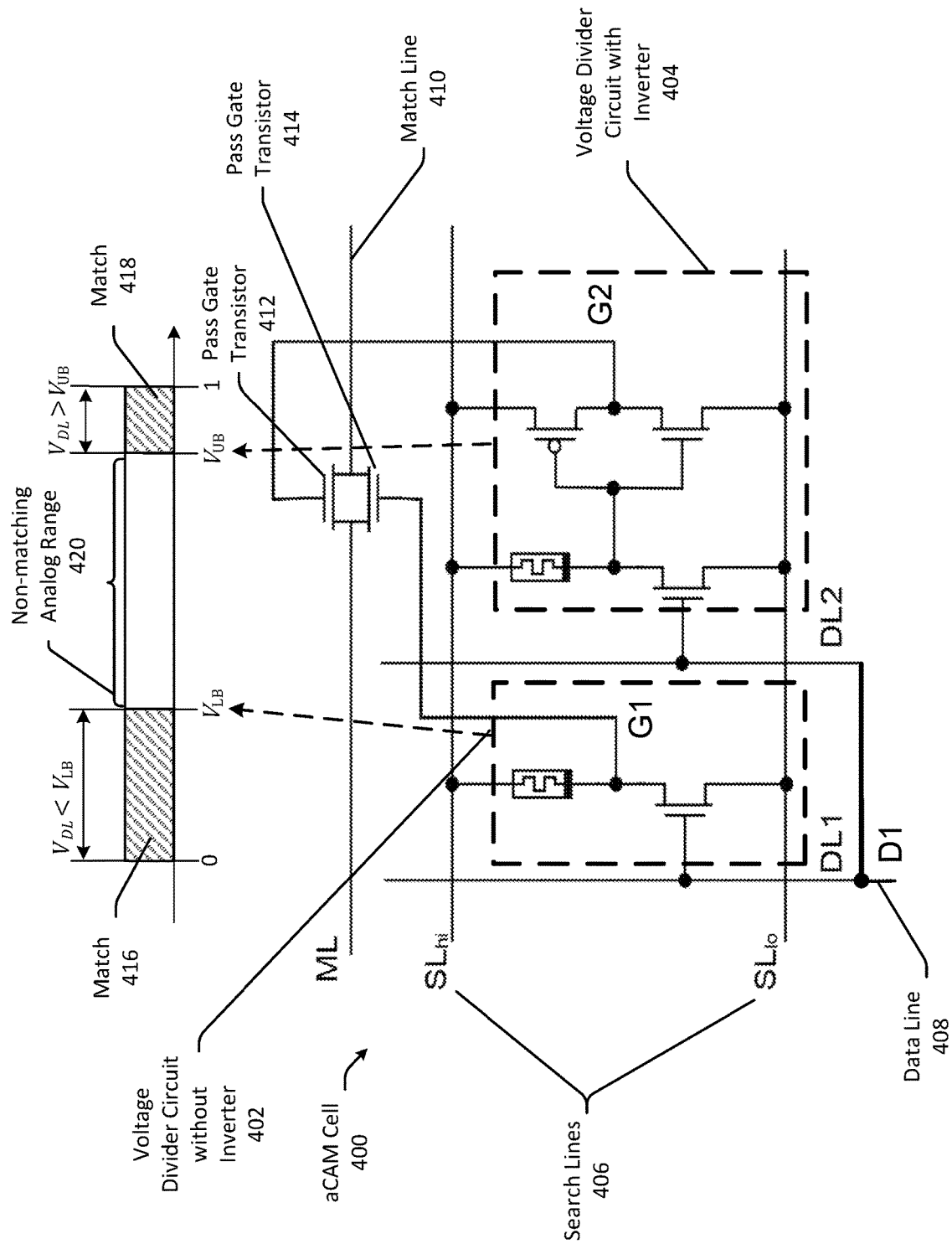
FIG. 4 depicts an alternative pass gate aCAM circuit implementation that encodes and enables searching outside of a range of analog values according to some embodiments.

FIG. 4 depicts an alternative pass gate aCAM circuit implementation that encodes and enables searching outside of a range of analog values according to some embodiments. The aCAM cell 400 depicted in FIG. 4 includes search lines 406, a data line 408, and a match line 410. The aCAM cell 400 further includes a voltage divider circuit 402 that does not include an inverter and a voltage divider circuit 404 that includes an inverter. In some embodiments, the voltage divider circuit 402 has the same circuit structure as the voltage divider circuit 102 and the voltage divider circuit 404 has the same circuit structure as the voltage divider circuit 104. That is, in some embodiments, the voltage divider circuit 402 includes the memristor 106 and the transistor 108 connected in series, where the memristor 106 is connected to one of the select lines 406 and the transistor 108 is connected to the other select line 406. Further, in some embodiments, the voltage divider circuit 404 includes the memristor 110 and the transistor 112 connected in series, which in turn, are connected to an inverter formed by transistors 114 and 116, and where the memristor 110 is connected to one of the select lines 406 and the transistor 112 is connected to the other select line 406.

The aCAM cell 400 differs from the aCAM cell 100 at least with respect to the replacement of the pull-down transistors 118, 120 with pass gate transistors 412, 414. Similar to the aCAM cell 100 of FIG. 1, respective voltages can be applied to the select lines 406 to activate the aCAM cell 400, or more specifically, the aCAM row containing the aCAM cell 400. The select lines 406 provide a voltage drop across the voltage divider circuit 402. The resistance across transistor 108 of the voltage divider circuit 402 determines, at least in part, the voltage G1, which in turn, determines the voltage applied to pass gate 414. Along similar lines, the resistance across transistor 112 of the voltage divider circuit 404 determines, at least in part, the voltage G2 at pass gate 412.

In contrast, however, to the aCAM cell 100, the match line 410 is not pre-charged to a high voltage. Rather, the match line 410 is charged up to Vdd on one side of the pass gates 412, 414 (e.g., the left side) and measured on the other side of the pass gates 412, 414. Only if there is an open path through at least one of the pass gates 412, 414, will the measurement pick up Vdd on the other side of the pass gates 412, 414 and detect a match. Thus, in aCAM cell 400, only one of the pass gate transistors 412, 414 needs to be in a particular state (i.e., switched ON) for an open path to exist for the match line voltage to be measurable on the other side of the pass gates 412, 414, and thus, for a match to be detected. While aCAM cell 100 operates on a different principle (i.e., pre-charging a match line and detecting a match as long as the pre-charged match line is not discharged as opposed to charging the match line and detecting a match based on measuring the voltage at a particular location along the match line), it is similar in that only one of the pull-down transistors 118, 120 needs to be in a particular state (i.e., OFF) for the match line to remain high, and thus, for a match to be detected.

Another distinction between the aCAM cell 400 and the aCAM cell 100 is with respect to which memristor establishes which bound of a non-matching analog range 420. In particular, in aCAM cell 400, a conductance $G_{M1}$ of the memristor 106 of the voltage divider circuit 402 may be tuned to establish a lower voltage bound $V_{LB}$ of the non-matching range of analog values 420, and a conductance $G_{M2}$ of the memristor 110 of the voltage divider circuit 404 may be tuned to establish an upper voltage bound $V_{UB}$ of the non-matching range 420. More specifically, the upper voltage bound $V_{UB}$ enforced by the aCAM cell 400 may be a function of the conductance Gm of the memristor 110 (i.e., $V_{UB}=f(G_{M2})$) and the lower voltage bound $V_{LB}$ may be a function of the conductance Gm of the memristor 106 (i.e., $V_{LB}=f(G_{M1})$). This is the reverse of the aCAM cell 100 in which the conductance Gm of the memristor 110 sets $V_{LB}$ and the conductance $G_{M2}$ of the memristor 106 sets $V_{UB}$.

Referring now to its operation in more detail, the aCAM cell 400 detects a match if a search input value falls outside of the non-matching analog range 420. That is, the cell 400 detects a match if a search input value—represented as input voltage $V_{DL}$ on the data line 408—satisfies the following Boolean OR statement: $V_{DL}<V_{LB}$ OR $V_{DL}>V_{UB}$. On the other hand, the cell 400 does not detect a match if the Boolean expression $V_{DL}<V_{LB}$ OR $V_{DL}>V_{UB}$ is FALSE, which only occurs if both conditions are false, and in which case, the input voltage $V_{DL}$ falls within the non-matching range 420 (i.e., $V_{LB}<V_{DL}<V_{UB}$).

Assume, for example, that an input search value mapped to an input data line voltage $V_{DL}<V_{LB}$ is applied on the data line 408. In some embodiments, the input data line voltage $V_{DL}$ is split into input voltages $V_{DL1}$ and $V_{DL1}$ which are applied to transistor 108 of voltage divider circuit 402 and transistor 112 of voltage divider circuit 404, respectively. The operation of voltage divider circuit 402 is of particular interest in this example scenario. As previously described in relation to the aCAM cell 100, when the input data line voltage $V_{DL2}$ is low, the transistor 108 remains OFF, and an effective conductance across the transistor 108 is low. This causes a large voltage drop across the transistor 108 and a high voltage G1 at the node between the memristor 106 and the transistor 108, which in turn, translates to a high voltage G1 at the pass gate transistor 414. In this manner, the pass gate transistor 414 is switched ON, a path is provided for the match line voltage through the pass gates, and a match is detected. Thus, in the aCAM cell 400, the voltage divider circuit 402 controls/enforces the outside-of-range search with respect to the lower bound $V_{LB}$ of the non-matching range 420.

The aCAM cell 400 detects a match if the input data line voltage $V_{DL}$ is less than $V_{LB}$ regardless of the voltage G2 that is applied to the pass gate transistor 412. In particular, in some embodiments, when $V_{DL}$ is less than $V_{LB}$, $V_{DL2}$ is not sufficient to overcome the threshold voltage of transistor 112. This results in a low effective conductance for the transistor 112 and a high voltage at the node between the memristor 110 and the transistor 112. This high voltage is inverted to obtain a low G2 voltage which is provided to the pass gate transistor 412, but which is not sufficient to turn the pass gate transistor 412 ON. However, because the voltage G1 supplied to the pass gate transistor 414 is sufficient to turn the transistor 414 ON and provide an unbroken path for the match line voltage, the fact that pass gate 412 remains OFF is of no consequence.

Assume now, on the other hand, that a $V_{DL} > V_{UB}$ is applied on the data line 408. The operation of voltage divider circuit 404 is of particular interest in this example scenario. As previously noted, $V_{DL}$ is split into $V_{DL1}$ and $V_{DL1}$, resulting in a high gate voltage at transistor 112 of the voltage divider circuit 404, which translates to a high effective conductance of transistor 112 as compared to the memristor 110, and thus, a large voltage drop across the memristor 110. As a result, the voltage at the node above the transistor 112 and below the memristor 110 is low, which when inverted, results in a high voltage G2 applied to the pass gate transistor 412, causing it to turn ON. In this manner, an unbroken path is provided for the match line voltage through the pass gates, resulting in a measurable voltage on the match line 410 after the pass gates, and consequently, a detected match. Thus, in the aCAM cell 400, the voltage divider circuit 404 controls/enforces the outside-of-range search with respect to the upper bound $V_{UB}$ of the non-matching range 420.

It should be noted that in this scenario in which $V_{DL}$ is greater than $V_{UB}$, the voltage G1 supplied to the pass gate transistor 414 is irrelevant. In particular, a high input voltage $V_{DL1}$ supplied to the transistor 108 of the voltage divider circuit 402 results in a high effective conductance of the transistor 108 and a relatively large voltage drop over the memristor 106, and thus, a low voltage G1 that is not sufficient to turn pass gate transistor 414 ON. However, since only one pass gate needs to be switched ON to provide a path for the match line voltage and detect a match, a $V_{DL}$ that is greater than $V_{UB}$—which results in the pass gate 412 switching ON—results in a detected match despite the pass gate transistor 414 remaining OFF.

Assume now that a $V_{DL}$ that is within the non-matching analog range 420 defined by $V_{LB}$ and $V_{UB}$ (i.e., $V_{LB} < V_{DL} < V_{UB}$) is applied on the data line 408. As previously noted, $V_{DL}$ is split into $V_{DL1}$ and $V_{DL2}$, where $V_{DL1}$ is supplied to the transistor 108 of the voltage divider circuit 402 and $V_{DL2}$ is supplied to the transistor 112 of the voltage divider circuit 404. In this example scenario, $V_{DL1}$ is sufficient to overcome the threshold voltage of transistor 108, resulting in a high effective conductance (i.e., low resistance state) for the transistor 108 as compared to the memristor 106, and causing a large voltage drop across the memristor 106. As such, a low voltage occurs at the node between the memristor 106 and the transistor 108, which corresponds to a low voltage G1 at the pass gate transistor 414, which is not sufficient to turn the transistor 414 ON.

VDU, on the other hand, is not sufficient to overcome the threshold voltage of transistor 112, resulting in a low effective conductance (i.e., high resistance state) for the transistor 112 as compared to the memristor 110, and causing a large voltage drop across the transistor 112 that results in a high voltage between the memristor 110 and the transistor 112. This high voltage is inverted, resulting in a low voltage G2 at pass gate transistor 412 that is insufficient to turn the transistor 412 ON. Thus, for any input voltage $V_{DL}$ that lies within the range 420 defined by $V_{LB}$ and $V_{UB}$ (i.e., $V_{LB} < V_{DL} < V_{UB}$), both pass gate transistors 412, 414 remain OFF, and no path is provided for the match line voltage to cross the pass gates. This results in a non-match.

Figure 5A:
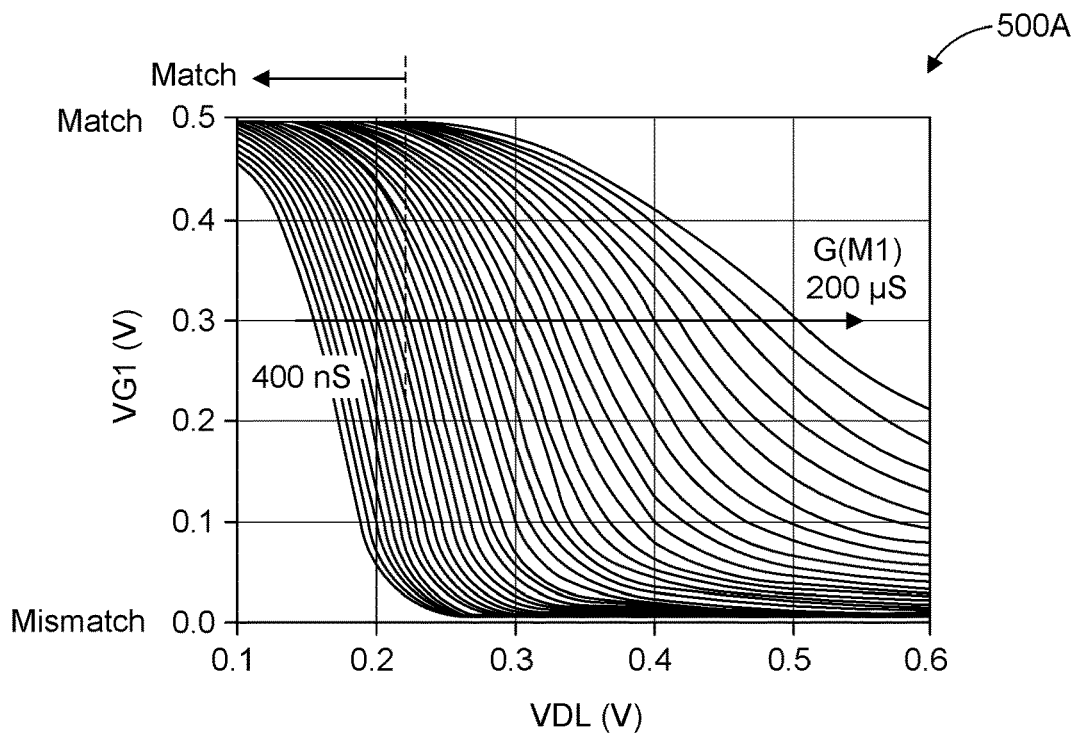
FIG. 5A is a voltage diagram depicting the matching of an input voltage below a lower bound by a non-inverting voltage divider circuit of the aCAM circuit of FIG. 4 according to some embodiments.

FIG. 5A depicts a voltage diagram 500A illustrating the matching of an input voltage below a lower bound by a non-inverting voltage divider circuit of the aCAM circuit 400 of FIG. 4. As shown in the voltage diagram 500A, assuming memristor 106 (M1) is tuned to a given conductance establishing a lower bound of the non-matching analog range 420 of the aCAM cell 400, input voltages $V_{DL}$ below a threshold indicated by the dashed line would result in a voltage G1 that is sufficient to turn ON the pass gate transistor 414, thereby providing an unbroken path for the match line voltage and resulting in a match.

Figure 5B:
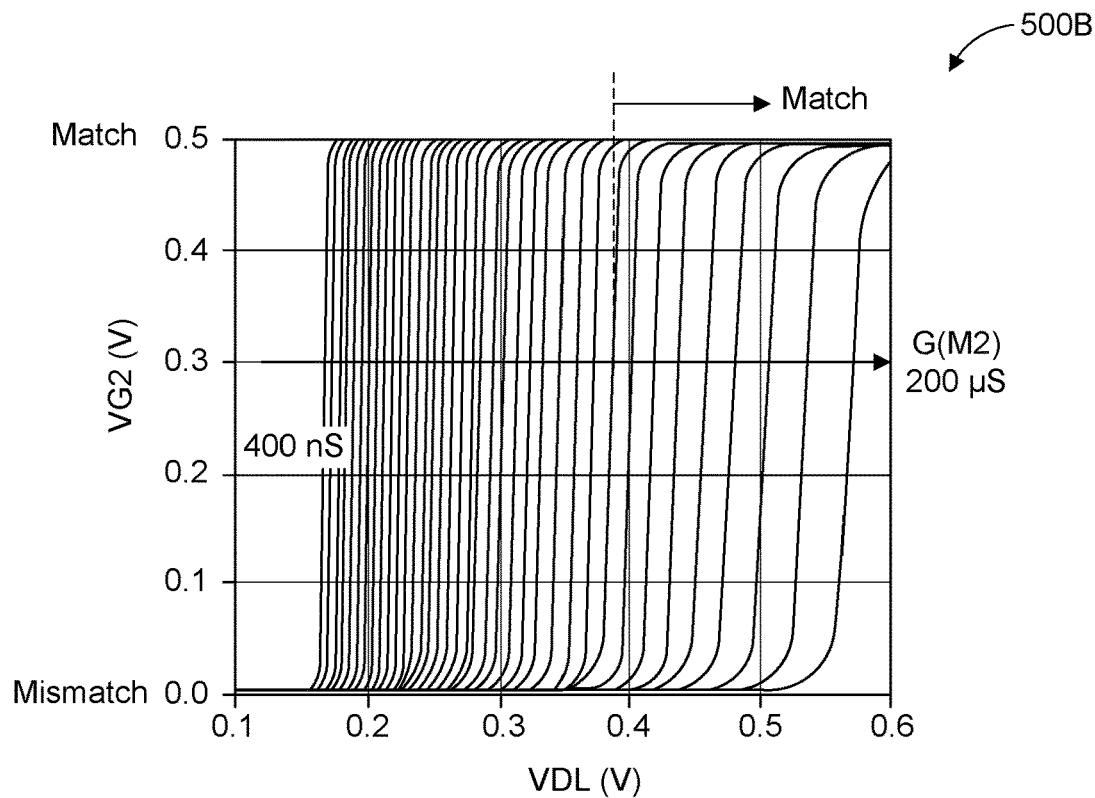
FIG. 5B is a voltage diagram depicting the matching of an input voltage above an upper bound by an inverting voltage divider circuit of the aCAM circuit of FIG. 4 according to some embodiments.

FIG. 5B depicts a voltage diagram 500B illustrating the matching of an input voltage above an upper bound by an inverting voltage divider circuit of the aCAM circuit 400 of FIG. 4. As shown in the voltage diagram 500B, assuming memristor 110 (M2) is tuned to a given conductance establishing an upper bound of a non-matching analog range, input voltages $V_{DL}$ above a threshold indicated by the dashed line would result in a voltage G2 that is sufficient to turn ON the pass gate transistor 412, thereby providing an unbroken path for the match line voltage and resulting in a match. It should be appreciated that voltage diagrams 500A and 500B individually illustrate the functionality of the non-inverting voltage divider circuit 102 and the inverting voltage divider circuit 104, respectively, of the aCAM cell 400, but do not necessarily collectively represent searching outside of the non-matching range 420. To represent searching outside of the specific range 420 depicted in FIG. 4, the lower and upper voltage bounds may be modified.

Figure 6:
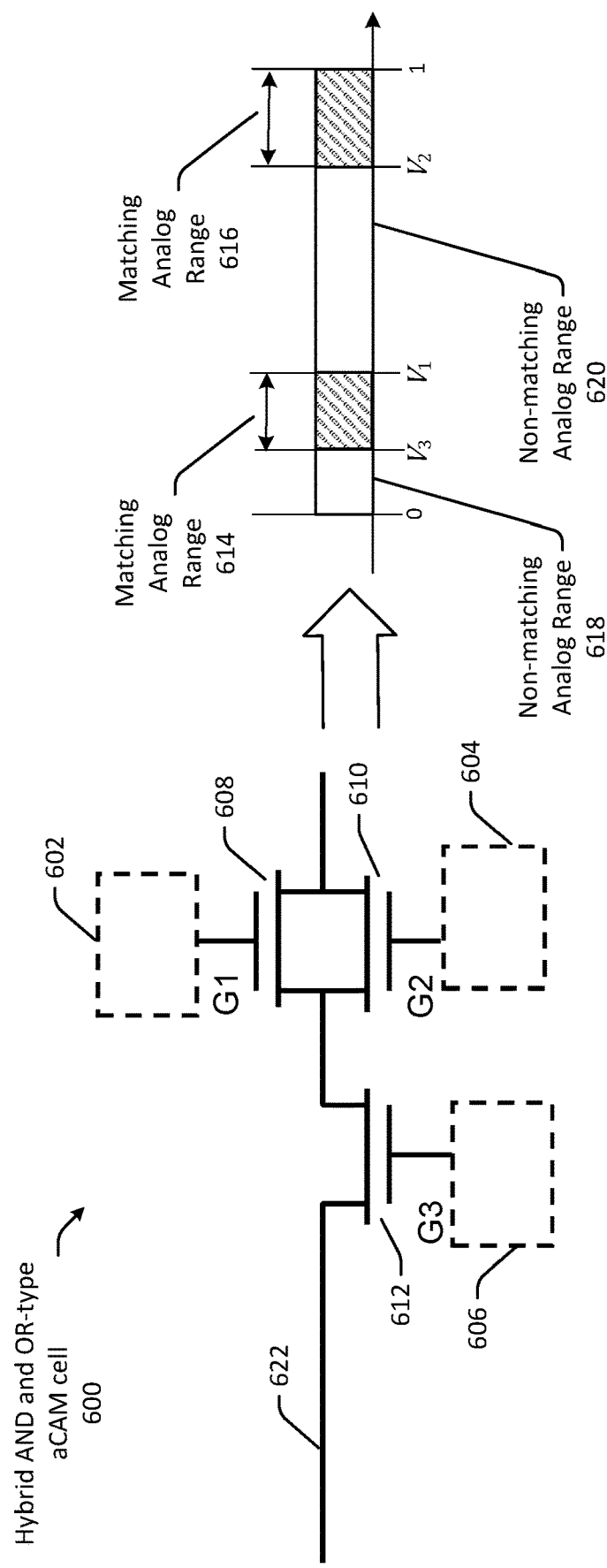
FIG. 6 depicts a pass gate implementation of a hybrid AND and OR-type aCAM cell that encodes and enables searching multiple disjoint ranges of analog values according to some embodiments.

FIG. 6 depicts a pass gate implementation of a hybrid AND and OR-type aCAM cell 600 that encodes and enables searching multiple disjoint ranges of analog values, or stated another way, searching outside of multiple disjoint ranges. The aCAM cell 600 includes various circuit sub-units 602, 604, 606. In some embodiments, the sub-unit 602 may have the same structure as the voltage divider circuit 402 of aCAM cell 400 (FIG. 4) and the sub-unit 604 may have the same structure as the voltage divider circuit 404 that includes the inverter. The sub-units 602, 604 are respectively connected to pass gate transistors 608, 610, which in turn, are connected to a match line 622. The pass gate transistors 608, 610 may be the pass gate transistors 414, 412, respectively. Thus, the combination of the sub-units 602 and 604 and the pass gate transistors 608, 610 is similar in structure to the aCAM cell 400.

The sub-unit 606 may be an additional voltage divider circuit with an inverter. The sub-unit 606 may have the same structure as the sub-unit 604, for example. The sub-unit 606 is connected to a pass gate transistor 612, which in turn, is connected to the match line 622. The sub-units 602, 604, 606 will be referred to hereinafter as voltage divider circuits 602, 604, 606, respectively, for ease of explanation. The additional voltage divider circuit 606 establishes a new lower bound $V_3$ for the aCAM cell 600 that enables multiple disjoint analog range segments to be searched. In particular, the aCAM cell 600 detects a match if the input voltage $V_{DL}$ is greater than $V_2$, in which case, $V_{DL}$ falls within the matching analog range 616, or if input voltage $V_{DL}$ is greater than $V_3$ and less than $V_1$, in which case, $V_{DL}$ falls within matching analog range 614. The aCAM cell 600 can also be thought of as enabling searching outside of multiple disjoint non-matching analog ranges 618, 620. That is, for any input voltage $V_{DL}$ that falls within the analog range 618 (i.e., $V_{DL}<V_3$) or for any input voltage $V_{DL}$ that falls within analog range 620 (i.e., $V_1<V_{DL}<V_2$), a match is not detected.

Due to the introduction of the additional voltage divider circuit 606 and the additional pass gate transistor 612 connected to the match line 622, the pass gate transistor 612 needs be switched ON in order for the aCAM cell 600 to return a match. That is, similar to the aCAM cell 400, at least one of the pass gate transistors 608, 610 needs to be ON to provide an unbroken path for the match line voltage, but in contrast to the aCAM cell 400, the pass gate transistor 612 also needs to be ON to provide the unbroken voltage path. More specifically, the aCAM cell 600 returns a match if the following Boolean expression is TRUE and does not return a match if the expression is FALSE: (G1 is high OR G2 is high) AND G3 is high. This expression is equivalent to the following expression: ($V_{DL}>V_2$ OR $V_{DL}<V_1$) AND $V_{DL}>V_3$.

Referring now in more detail to the operation of the aCAM cell 600, assume that an input voltage $V_{DL}$ that is less than $V_3$ is supplied to the cell 600. This corresponds to a scenario in which the input voltage $V_{DL}$ falls within the non-matching analog range 618. In this scenario, the voltage G2 at pass gate transistor 610 is low, but the voltage G1 at pass gate transistor 608 is high. As such, even though pass gate transistor 602 remains OFF, pass gate transistor 610 is switched ON. The voltage G3 at pass gate transistor 612, however, is low, and thus, transistor 612 remains OFF, and as a result, an unbroken path does not exist for the voltage on the match line 622 to cross the pass gates. Accordingly, the match line voltage is not measurable across the pass gates, and a match is not detected.

The voltage divider circuit 606 operates similarly to voltage divider circuit 604. More specifically, in this scenario, the input voltage $V_{DL}$ is not sufficient to overcome the threshold voltage of the transistor 112 of the voltage divider circuit 606. Thus, the transistor 112 has a low effective conductance (high resistance) relative to the memristor 110, resulting in a large voltage drop across the transistor 112, and as such, a high voltage above the transistor 112 (e.g., between the memristor 110 and the transistor 112). This high voltage is inverted, resulting in a low voltage G3 that is insufficient to turn pass gate transistor 612 ON. It should be appreciated that this scenario demonstrates how the voltage divider circuit 606 and pass gate transistor 612 enforce the lower voltage bound $V_3$ resulting in a matching range 614 that does not extend all the way to the minimum voltage capable of being stored/searched by the cell 600. That is, in the absence of the voltage divider circuit 606, any input voltage $V_{DL}<V_1$ would have resulted in a match, similar to aCAM cell 400.

Assume now that an input voltage $V_{DL}$ that is greater than $V_3$ but less than $V_1$ is supplied to the aCAM cell 600. This corresponds to a scenario in which the input voltage $V_{DL}$ falls within the matching analog range 614. In this scenario, the input voltage $V_{DL}$ is sufficient to overcome a threshold voltage of the transistor 112 of the voltage divider circuit 606, which results in a high effective conductance for the transistor 112, a large voltage drop across the memristor 110, and a low voltage at the node between the memristor 110 and the transistor 112. This low voltage is inverted to obtain a high voltage G3 that turns ON the pass gate transistor 612. In addition, the input voltage $V_{DL}$ is not sufficient to overcome the threshold voltage of transistor 108 of the voltage divider circuit 602, resulting in a low effective conductance of the transistor 108 and a relatively large voltage drop across the transistor 108. Thus, the voltage G1 between the memristor 106 and the transistor 108 is high, and this high voltage G1 is applied to the pass gate transistor 608 to switch it ON. By virtue of pass gate transistor 612 and at least one of the pass gate transistors 608, 610 (i.e., pass gate transistor 609) being ON, an unbroken path is provided for the match line voltage, and a match is detected.

It should be appreciated that a match is detected in this scenario regardless of what the voltage G2 is and regardless of the state of the pass gate transistor 610. That is, the input voltage $V_{DL}$ may be insufficient to overcome the threshold voltage of transistor 112, causing a high voltage at the node between the memristor 110 and the transistor 112 due to the low effective conductance of the transistor 112. This high voltage is inverted to obtain a low voltage G2, which is applied to the pass gate transistor 610. The voltage G2 is not sufficient to switch the transistor 610 ON. This is, however, of no consequence in this scenario because the pass gate transistor 612 is ON, and thus, only one of the pass gate transistors 608, 610 needs to be switched ON to provide the unbroken path for the match line voltage through the pass gates.

Assume now that an input voltage $V_{DL}$ that is greater than $V_1$ but less than $V_2$ is supplied to the aCAM cell 600. This corresponds to a scenario in which the input voltage $V_{DL}$ falls within the non-matching analog range 620. In this scenario, $V_{DL}$ is not sufficient to overcome the threshold voltage of transistor 112 of the voltage divider circuit 604, which results in the transistor 112 having a low effective conductance relative to the memristor 110, and thus, a high voltage at the node between the memristor 110 and the transistor 112. This high voltage is inverted to produce a low voltage G2 at the pass gate transistor 604 that is insufficient to turn the transistor 604 ON, causing it to remain in an OFF state. Moreover, the input voltage $V_{DL}$ is sufficient to overcome the threshold voltage of transistor 108 of the voltage divider circuit 602, which results in the transistor 108 having a high effective conductance relative to the memristor 106, and thus, a low voltage at the node between the memristor 106 and the transistor 108. This low voltage, which is supplied as voltage G1 to pass gate transistor 608, is insufficient to turn the transistor 608 ON. As a result of neither of pass gate transistors 608, 610 being ON, no path exists for the match line voltage to cross the pass gates 608, 610, and thus, no match is detected.

It should be appreciated that in the scenario described immediately above, a match is not detected regardless of the state of the pass gate transistor 612. In particular, the input voltage $V_{DL}$ may be sufficient to turn transistor 112 of the voltage divider circuit 606 ON, resulting in a low voltage at the node between the memristor 110 and the transistor 112, which is then inverted to produce a high voltage G3 at the pass gate transistor 612. The high voltage G3 may be sufficient to turn the pass gate transistor 612 ON, but this is irrelevant in this scenario because neither pass gate 608 or pass gate 610 is switched ON, and thus, a complete unbroken path for the match line voltage does not exist across all of the pass gates connected to the match line 622.

Assume now that an input voltage $V_{DL}$ that is greater than $V_2$ is supplied to the aCAM cell 600. This corresponds to a scenario in which the input voltage $V_{DL}$ falls within the matching analog range 616. In this scenario, $V_{DL}$ is sufficient to overcome the threshold voltage of transistor 112 of the voltage divider circuit 604, which results in the transistor 112 having a high effective conductance relative to the memristor 110, and thus, a large voltage drop across the memristor 110 and a low voltage at the node between the memristor 110 and the transistor 112. This low voltage is inverted to yield a high voltage G2 at the transistor 604, causing it to turn ON. The voltage G3 is similarly high and sufficient to turn ON pass gate transistor 612. Thus, a complete, unbroken path across the pass gates is provided for the match line voltage via pass gate 612 and pass gate 610, thereby resulting in a detected match. Similar to other scenarios described earlier, the voltage G1 being too low to switch pass gate 608 ON is of no consequence because only one of the pass gates 608, 610 needs to be switched ON to provide the unbroken path for the match line voltage.

It should be appreciated that aCAM cell 600 is an illustrative pass gate implementation for enabling searching of multiple segments of analog values. In particular, the specific aCAM cell 600 implementation is configured to search two disjoint analog ranges 614, 616. The combination of AND and OR logic embodied in the aCAM cell 600 can be extended to cover any arbitrary number of segments of analog ranges. For instance, an additional voltage divider circuit without inverter 102 and associated pass gate transistor may be added to the cell 600. This additional voltage divider circuit may enforce a new upper bound that is greater than $V_2$ but less than the maximum voltage storable/searchable by the cell 600. More generally, one or more additional voltage divider circuits (e.g., voltage divider circuit 102 and/or voltage divider circuit 104) and associated pass gate transistors may be added to the cell 600 t obtains aCAM cells capable of searching any desired arbitrary combination of analog range segments.

Figure 7:
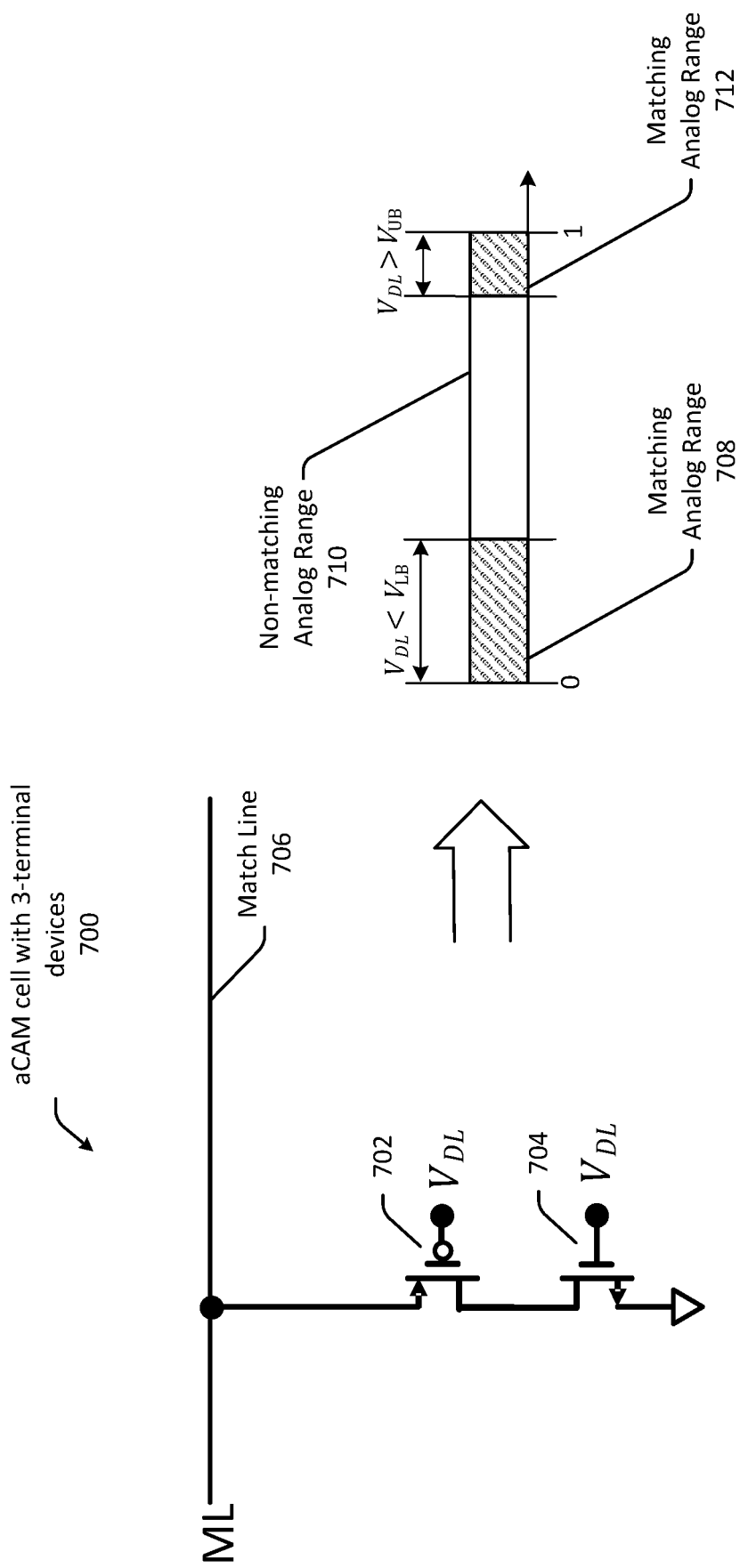
FIG. 7 depicts an aCAM circuit implementation using 3-terminal devices that encodes and enables searching outside of a range of analog values according to some embodiments.

FIG. 7 depicts an aCAM circuit implementation using 3-terminal devices that encodes and enables searching outside of a range of analog values according to some embodiments. The aCAM cell 700 includes a first 3-terminal device 702 and a second 3-terminal device 704 connected in series to a match line 706. The device 702 may be, for example, a p-type ferroelectric field-effect transistor (Fe FET) (a type of FET that includes a ferroelectric material sandwiched between the gate electrode and the source-drain conduction region of the device); a floating gate MOSFET (e.g., flash, ionic floating gate, etc.); and so forth. The device 704 may be, for example, an n-type Fe FET, floating gate MOSFET, or the like.

In some embodiments, the p-type 3-terminal device 702 encodes an upper bound $V_{UB}$ of a non-matching analog range 710 and the n-type 3-terminal device 704 encodes a lower bound $V_{LB}$ of the non-matching range 710. More specifically, in some embodiments, $V_{UB}$ may be a threshold voltage of the p-type 3-terminal device 702, which switches ON when an input data line voltage $V_{DL}$ is applied that is lower than a threshold voltage of the device 702. Similarly, $V_{LB}$ may be a threshold voltage of the n-type 3-terminal device 704, which switches ON when an input data line voltage $V_{DL}$ is applied that is higher than a threshold voltage of the device 704. As such, for any input data line voltage $V_{DL}$ applied to the devices 702, 704, where $V_{DL}>V_{UB}$, the p-type device 702 is not switched ON because $V_{DL}$ is not lower than a threshold voltage of device 702. As a result, a discharge path is not completed (even if the n-type device 704 is switched ON), the match line 706 is not discharged, and a match is detected. Accordingly, any input data line voltage $V_{DL}>V_{UB}$ falls within the matching analog range 712.

Further, for any input data line voltage $V_{DL}$ applied to the devices 702, 704, where $V_{DL}<V_{LB}$, the n-type device 704 is not switched ON because $V_{DL}$ is not higher than a threshold voltage of device 704. As a result, a discharge path is not completed (even if the p-type device 702 is switched ON), the match line 706 is not discharged, and a match is detected. Accordingly, any input data line voltage $V_{DL}>V_{DL}$ falls within the matching analog range 708. Finally, when an input data line voltage $V_{DL}$, where $V_{LB}<V_{DL}<V_{UB}$, is applied to the devices 702, 704, both devices 702, 704 are switched ON because $V_{DL}$ is both lower than the threshold voltage of the p-type device 702 and higher than the threshold voltage of the n-type device 704. As a result, the discharge path is completed, the match line 706 is discharged, and a match is not detected. In this manner, the aCAM cell 700 enables storing and searching outside of a range (e.g., outside of the non-matching analog range 710).

Figure 8:
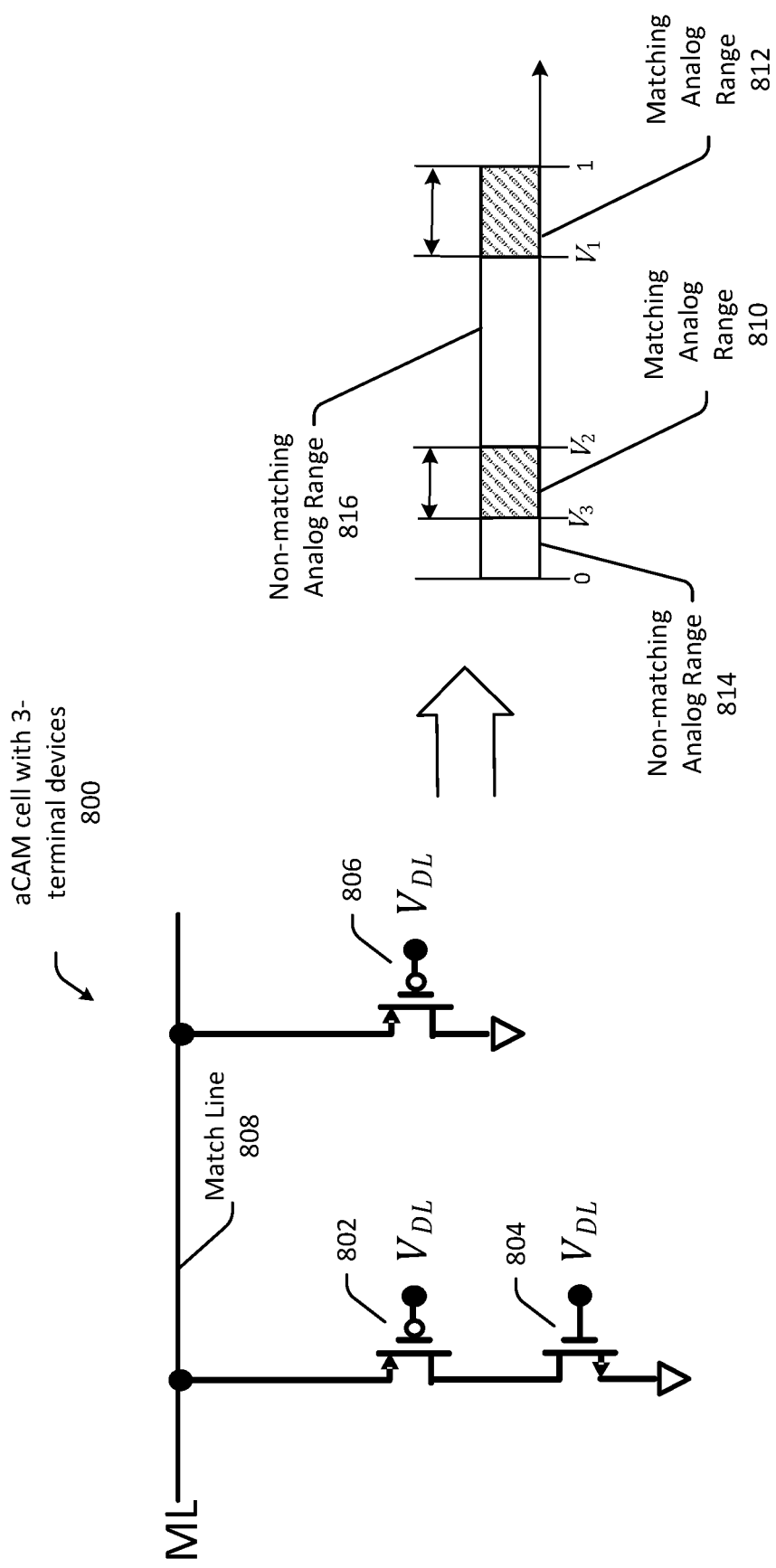
FIG. 8 depicts an aCAM circuit implementation using 3-terminal devices that encodes and enables searching multiple disjoint ranges of analog values according to some embodiments.

FIG. 8 depicts an aCAM circuit implementation using 3-terminal devices that encodes and enables searching multiple disjoint ranges of analog values according to some embodiments. Similar to the aCAM cell 700, the aCAM cell 800 includes a first 3-terminal device 802 and a second 3-terminal device 804 connected in series to a match line 808. However, in contrast to the aCAM cell 700, the aCAM cell 800 further includes a third 3-terminal device 806 connected to the match line 808 in parallel with the in-series devices 802, 804. In some embodiments, the device 802 may be a p-type 3-terminal device similar to device 702, the device 804 may be a n-type 3-terminal device similar to device 704, and the device 806 may be a p-type device similar to device 802. Each of the devices 802, 804, 806 may be any of the example types of 3-terminal devices previously mentioned.

As previously noted, the aCAM cell 800 enables searching multiple disjoint analog ranges. Similar to the aCAM cell 700, the p-type 3-terminal device 802 encodes an upper bound $V_1$ of a non-matching analog range 816 and the n-type 3-terminal device 804 encodes a lower bound $V_2$ of the non-matching range 816. $V_1$ may be a threshold voltage of the p-type device 802 and $V_2$ may be a threshold voltage of the n-type device 804. The p-type 3-terminal device 806 introduces another bound in the form of an upper bound $V_3$ of another non-matching analog range 814, which may be a threshold voltage of the device 806. Thus, connecting the device 806 to the match line 808 in parallel with the in-series devices 802, 804, enables the aCAM cell 800 to store/search multiple disjoint matching analog ranges 810, 812, or stated another way, store/search outside of multiple disjoint non-matching analog ranges 814, 816.

In particular, similar to aCAM cell 700, for any input data line voltage $V_{DL}$ applied to the devices 802, 804, 806, where $V_{DL}>V_1$, the p-type device 802 is not switched ON because $V_{DL}$ is not lower than a threshold voltage of device 802. As a result, a discharge path is not completed (even if the n-type device 804 is switched ON), and the match line 706 is not discharged by the in-series devices 802, 804. Similarly, $V_{DL}$ is also not lower than a threshold voltage of p-type device 806, and thus, the device 806 is also not switched ON, and the match line 808 is also not discharged by the device 806. Accordingly, any input data line voltage $V_{DL}>V_1$ falls within the matching analog range 812.

Further, similar to aCAM cell 700, for any input data line voltage $V_{DL}$ applied to the devices 802, 804, where $V_{DL}<V_3<V_2$, the n-type device 804 is not switched ON because $V_{DL}$ is not higher than a threshold voltage ($V_2$) of device 804. As a result, a discharge path is not completed with respect to the in-series devices 802, 804 (even if the p-type device 802 is switched ON) and the match line 808 is not discharged. However, in contrast to the aCAM cell 700, the match line 808 is discharged by the device 806. In particular, for $V_{DL}<V_3$, the p-type device 806 is switched ON because $V_{DL}$ is lower than a threshold voltage ($V_3$) of device 806. As a result, the match line 808 is discharged by the device 806, and a match is not detected. Accordingly, any input data line voltage $V_{DL}<V_3$ falls within the non-matching analog range 814.

Referring now to other example scenarios, when an input data line voltage $V_k$, where $V_3<V_{DL}<V_2$, is applied to the devices 802, 804, 806, p-type device 806 remains OFF because $V_{DL}$ is not lower than a threshold voltage ($V_3$) of the device 806. Thus, device 806 does not discharge the match line 808. Further, n-type device 804 also remains OFF because $V_{DL}$ is lower than the threshold voltage ($V_2$) of the device 804. Thus, despite device 802 being switched ON because $V_{DL}$ is lower than the threshold voltage $V_1$ of the p-type device 802, the discharge path associated with the in-series devices 802, 804 remains closed because device 804 is OFF. Therefore, because no completed discharge path exists, the match line 808 is not discharged, and a match is detected when the input data line voltage $V_{DL}$ is within the matching analog range 810.

Finally, when an input data line voltage $V_{DL}$, where $V_2<V_{DL}<V_1$, is applied to the devices 802, 804, 806, p-type device 806 is switched ON because $V_{DL}$ is greater than the threshold voltage ($V_3$) of the device 806. Thus, p-type device 806 does not discharge the match line 808. Both in-series devices 802, 804, however, switch ON because $V_{DL}$ is lower than the threshold voltage of the p-type device 802 ($V_1$) and higher than the threshold voltage ($V_2$) of the n-type device. As a result, the discharge path through devices 802, 804 is completed, the match line 808 is discharged, and a match is not detected for any input data line voltage $V_{DL}$ that falls within the non-matching analog range 816.

Figure 9:
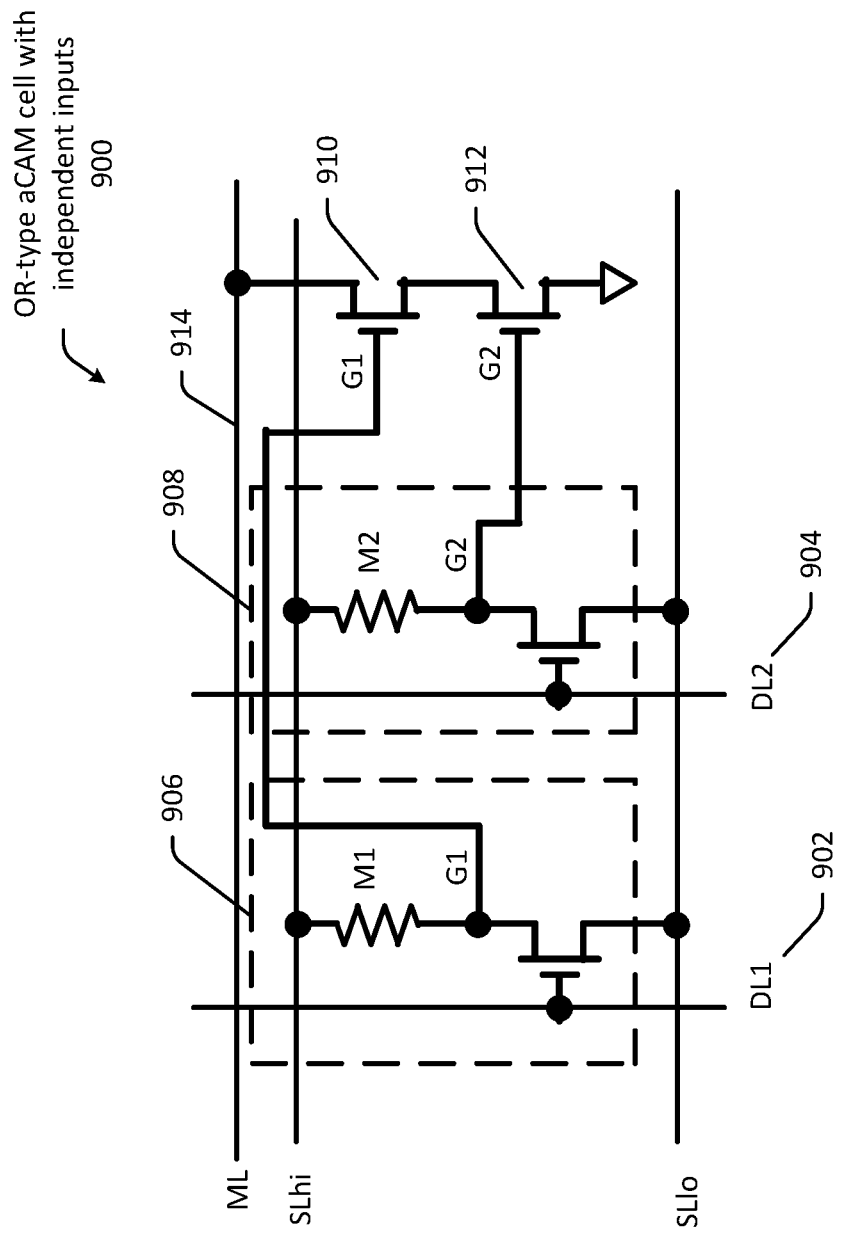
FIG. 9 depicts an OR-type aCAM circuit implementation that encodes and enables searching arbitrary ranges of analog values for multiple independent inputs according to some embodiments.

FIG. 9 depicts an OR-type aCAM circuit implementation that encodes and enables searching arbitrary ranges of analog values for multiple independent inputs according to some embodiments. The aCAM cell 900 depicted in FIG. 9 includes a first voltage divider circuit 906 and a second voltage divider circuit 908. Each of the first voltage divider circuit 906 and the second voltage divider circuit 908 have a similar circuit structure to the voltage divider circuit 102 (FIG. 1). The first voltage divider circuit 906 is connected to a pull-down transistor 910 and the second voltage divider circuit 908 is connected to a pull-down transistor 912. Both the pull-down transistors 910, 912 are connected in series to a match line 914. Further, data line inputs to the aCAM cell 900 are not tied together as they were in previously described aCAM implementations. In particular, rather than an input data line voltage being split and then supplied to multiple sub-circuits, a first data line input 902 (DL1) provided to the voltage divider circuit 906 is independent of a second data line input 904 (DL2) provided to the voltage divider circuit 908.

The aCAM cell 900 detects a match when the following Boolean expression is TRUE: G1 is low OR G2 is low, where G1 is a gate voltage applied to the pull-down transistor 910 and G2 is a gate voltage applied to the pull-down transistor 912. This expression is equivalent to the Boolean expression $V_{DL1}>V_1$ OR $V_{DL1}>V_2$. Thus, the example aCAM cell 900 implements the OR of two "greater than" inequalities. It should be appreciated that one or both of the circuits 906, 908 could be reversed with an inverter circuit to implement a "less than" inequality. For instance, the voltage divider circuit 906 and/or the voltage divider circuit 908 could be replaced with a circuit having a similar structure as the voltage divider circuit 104 (FIG. 1). Alternatively, a "less than" inequality can also be implemented without altering the circuit structure of the cell 900. In particular, rather than implementing an inverter circuit, the input and the memristor of a voltage divider circuit of the cell 900 can be reversed. Taking the input data line voltage $V_{DL2}$ on data line 904 as an example, $V_{DL1}>V_2$ is equivalent to $(V_{max}-V_{DL1})<(V_{max}-V_2)$. Thus, the input $V_{DL1}$ on data line 904 can be inverted to obtain $V_{max}-V_{DL1}$ and a memristor of the circuit 908 can be programmed to encode $(V_{max}-V_2)$ instead of $V_2$. The voltage divider circuit 908 modified in this manner would implement the less than inequality $V_{DL2}<V_2$.

As disclosed herein, aCAM circuit implementations according to embodiments of the disclosed technology provide the capability to store and search outside of a range or within/outside of multiple disjoint ranges. This capability is useful in a wide range of application contexts. As such, aCAM circuit implementations according to embodiments of the disclosed technology offer a technical solution that prior aCAM circuits do not. For instance, access control lists and network routing functions often require searching if an input falls outside of a range instead of within a range. The aCAM circuits according to embodiments of the disclosed technology provide this capability, while prior aCAM circuits do not. As another example, for some applications like random forest decision lookup, an input feature value is compared (matched) to multiple segments within an allowable range. The aCAM circuit implementations disclosed herein according to embodiments of the disclosed technology can perform this function in a single step, thereby dramatically accelerating the classification lookup.

In some embodiments, the aCAM cell 900 may be extended to accommodate more than two inputs (e.g., DL3, DL4, etc.). For each such additional input, an additional voltage divider circuit may be provided that receives the additional input. Further, in some embodiments, each such additional voltage divider circuit drives a corresponding additional pull-down transistor connected to the match line 914 in series with pull-down transistors 910, 912. For instance, a third data line input may be used to apply a third independent input voltage to a third voltage divider circuit, which in turn, drives a third pull-down transistor connected to the match line 914 in series with the pull-down transistors 910, 912. This can be extended for any number of additional independent inputs to implement an OR clause of desired length.

Figure 10:
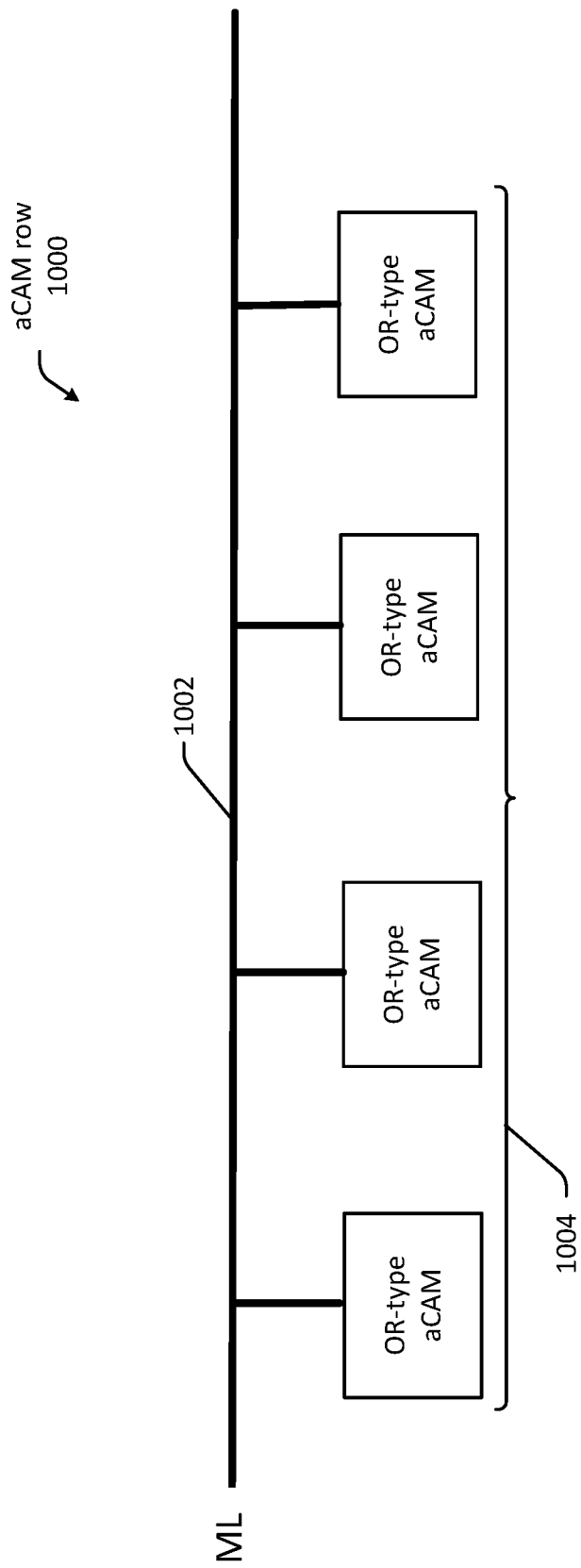
FIG. 10 depicts extending the OR-type aCAM circuit implementation of FIG. 13 to enable rapid testing of input variable values in connection with circuit satisfiability problems according to some embodiments.

FIG. 10 depicts extending the OR-type aCAM circuit implementation of FIG. 9 to enable rapid testing of input variable values in connection with circuit satisfiability problems according to some embodiments. The Boolean satisfiability problem (also referred to as B-SAT) is a problem of determining if there exists an interpretation that satisfies a given Boolean formula. In other words, it asks whether the variables of a given Boolean formula can be consistently replaced by the values TRUE and FALSE in such a way that the formula evaluates to TRUE. If this is the case, the formula is called satisfiable. On the other hand, if no such assignment exists, the function expressed by the formula is FALSE for all possible variable assignments and the formula is unsatisfiable. For instance, X AND NOT Y is satisfiable, but X and NOT X is not. B-SAT is an NP-complete problem, which means that all problems in the complexity class NP—which includes a wide range of natural decision and optimization problems—are at most as difficult to solve as B-SAT.

A particular type of B-SAT problem is the 3-SAT problem which involves determining the satisfiability a Boolean formula that is conjunctive normal form (CNF). An expression in CNF is an AND of OR clauses, where there are 3 variables for each OR clause. An example of a Boolean expression in CNF is the following: (−x OR −y OR z) AND (−x OR y OR −z) AND (x OR −y OR −z) AND (x OR y OR z). Since the aCAM cell 900 of FIG. 9 implements a string of OR operations and, as mentioned above, can take three independent inputs (in fact an arbitrary number of inputs), a row 1000 containing a collection 1004 of such cells connected to a shared match line 1002 can be formed to implement the AND of the OR operations of each cell. This provides various technical benefits including, for instance, the capability to rapidly test any input of variable values for satisfaction of a CNF expression. Further, the inputs can be extended beyond Boolean values to include continuous rather than binary inputs such that the aCAM is capable of searching and evaluating a system of inequalities. This constitutes an analog extension of the Boolean circuit satisfiability problem.

Figure 11:
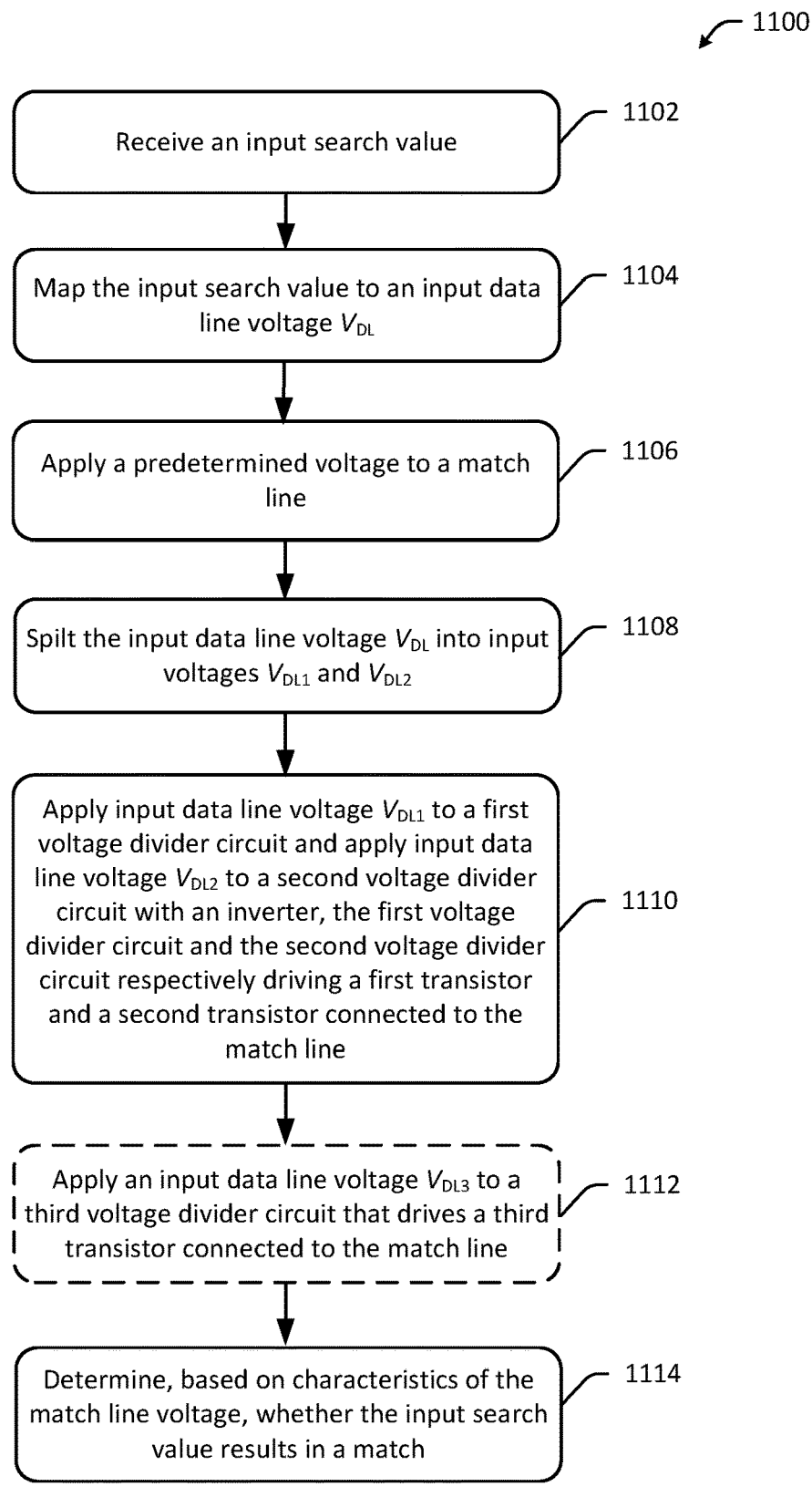
FIG. 11 is a flow diagram of an illustrative method for using aCAM circuit implementations to search outside of an analog range or to search multiple disjoint analog ranges according to some embodiments.
Figure 12:
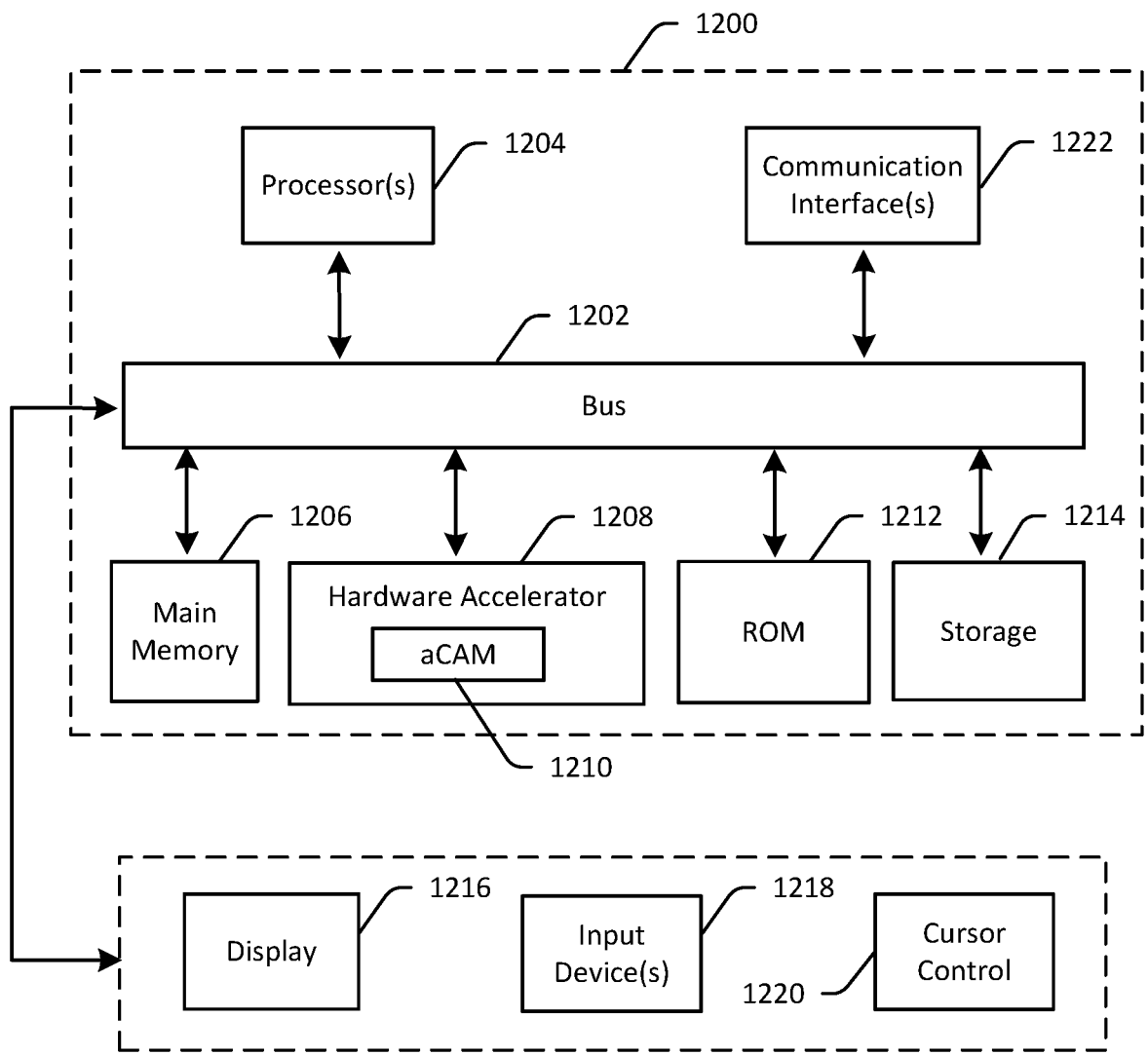
FIG. 12 is an example computing component that may be used to implement various features according to some embodiments.

FIG. 11 is a flow diagram of an illustrative method 1100 for using aCAM circuit implementations to search outside of an analog range or to search multiple disjoint analog ranges according to some embodiments. In some embodiments, the method 1100 may be performed responsive to one or more processing units (e.g., FIG. 12, processor(s) 1204 or hardware accelerator 1208) execute machine/computer-executable instructions stored in a storage device such as main memory 1206, read-only memory (ROM) 1212, and/or storage 1214 (FIG. 12). In some embodiments, the method 1100 may be performed, at least in part, by hard-wired logic embodied in the hardware accelerator 1208. The method 1100 will be illustratively described hereinafter as being performed by a hardware accelerator (e.g., hardware accelerator 1208) that includes the aCAM being used in the method 1100 to perform a search function.

At block 1102 of the method 1100, the hardware accelerator receives an input search value. The input search value may be a discrete value (e.g., a Boolean value) or an analog value. At block 1104, the hardware accelerator maps the input search value to an input data line voltage $V_{DL}$. At block 1106, the hardware accelerator applies a predetermined voltage to a match line of an aCAM row. In some embodiments, such as those in which the aCAM cell 100, the aCAM cell 300, and/or the aCAM cell 700 is being used, the match line is pre-charged, and a match is detected/not detected based on whether the match line is discharged. In other embodiments, such as those in which the aCAM cell 400, the aCAM cell 600, and/or the aCAM cell 800 is being used, a voltage is applied to the match line on one side of multiple pass gates, and a match is detected/not detected based on whether the match line voltage is measurable on the other side of the pass gates.

At block 1108, the hardware accelerator splits the input data line voltage $V_{DL}$ into input voltages $V_{DL1}$ and $V_{DL1}$. In some embodiments, the input data line voltage $V_{DL}$ is split into more than two input voltages depending on the number of voltage divider circuits included in an aCAM cell. Further, in some other embodiments, the data line inputs may be independent of one another.

At block 1110, the hardware accelerator applies the input voltage $V_{DL1}$ to a first voltage divider circuit of an aCAM cell and applies the input voltage $V_{DL2}$ to a second voltage divider circuit of the aCAM cell. In some embodiments, the input data line voltage $V_{DL}$ is split into more than two input voltages if additional voltage divider circuits are provided in the aCAM cell. Alternatively, in some embodiments, the multiple input voltages may be independent of one another. In some embodiments, the first voltage divider circuit may be circuit 102 without an inverter and the second voltage divider circuit may be circuit 104 that includes an inverter. Further, the first voltage divider circuit may drive a first transistor connected to the match line and the second voltage divider circuit may drive a second transistor connected to the match line. In some embodiments (e.g., aCAM cell 100), the first and second transistors may be pull-down transistors connected in series to the match line. In other embodiments (e.g., aCAM cell 400), the first and second transistors may be pass gate transistors.

At block 1112, the hardware accelerator may optionally apply an input data line voltage $V_{DL3}$ to a third voltage divider circuit that drives a third transistor connected to the match line. The third voltage divider circuit may be, for example, another voltage divider circuit 102 that drives a third pull-down transistor connected to the match line in parallel with the in-series pull-down transistors (e.g., aCAM cell 300). Alternatively, the third voltage divider circuit may be, for example, another voltage divider circuit 104 that drives a third pass gate transistor connected in series with the first and second pass gate transistors (e.g., aCAM cell 600). It should be appreciated that the aCAM cell may include more than three voltage divider circuits and additional corresponding transistors driven by such additional circuits, in which case, additional data line inputs may be fed to the additional circuits.

At block 1114, the hardware accelerator may determine, based on characteristics of the match line voltage, whether the input search value results in a match. In the pull-down transistor aCAM implementations disclosed herein, the hardware accelerator may detect a match if the match line voltage is not discharged. In the pass gate aCAM implementations disclosed herein, the hardware accelerator may detect a match if the match line voltage applied on one side of the pass gates can be measured on the other side of the pass gates. Depending on the implementation, a detected match may correspond to the input search value being outside of an analog range of values or the input search value being within one of multiple disjoint analog ranges.

FIG. 12 depicts a block diagram of an example computer system 1200 in which various of the embodiments described herein may be implemented. The computer system 1200 includes a bus 1202 or other communication mechanism for communicating information, one or more hardware processors 1204 coupled with bus 1202 for processing information. Hardware processor(s) 1204 may be, for example, one or more general purpose microprocessors.

The computer system 1200 also includes a main memory 1206, such as a random access memory (RAM), cache and/or other dynamic storage devices, coupled to bus 1202 for storing information and instructions to be executed by processor 1204. Main memory 1206 also may be used for storing temporary variables or other intermediate information during execution of instructions to be executed by processor 1204. Such instructions, when stored in storage media accessible to processor 1204, render computer system 1200 into a special-purpose machine that is customized to perform the operations specified in the instructions.

The computer system 1200 additionally includes a hardware accelerator 1208. The hardware accelerator 1208 may be configured to execute instructions (i.e. programming or software code) stored in the main memory 1206, ROM 1212, and/or storage 1214 to encode a set of logical rules embodied in a data structure (e.g., the decision tree 104) into an aCAM array 1210. In an example implementation, the exemplary hardware accelerator 1208 may include multiple integrated circuits, which in turn, can include Application-Specific Integrated Circuits (ASICs), Field Programmable Gate Arrays (FPGAs) or other Very Large Scale Integrated circuits (VLSIs). The integrated circuits of the exemplary hardware accelerator 1208 may be specifically optimized to perform a discrete subset of computer processing operations, or execute a discrete subset of computer-executable instructions, in an accelerated manner. For example, hardware accelerator 1208 may be configured or manufactured to implement a set of logical rules embodied in a data structure such as the decision tree 104 on the a-CAM array 1210.

The a-CAM array 1210 may include a non-volatile memory built using technologies that include for instance, resistive switching memory (i.e. memristor), phase change memory, magneto-resistive memory, ferroelectric memory, some other resistive random access memory device (Re-RAM), or combinations of those technologies. More generally, the aCAM array 1210 may be implemented using technologies that permit the aCAM 1210 to hold its contents even when power is lost or otherwise removed. Thus, data in the aCAM 1210 "persists" and the aCAM 1210 can act as what is known as a "non-volatile memory."

The computer system 1200 further includes a read only memory (ROM) 1212 or other static storage device coupled to bus 1202 for storing static information and instructions for processor 1204. A storage device 1214, such as a magnetic disk, optical disk, or USB thumb drive (Flash drive), etc., is provided and coupled to bus 1202 for storing information and instructions.

The computer system 1200 may be coupled via bus 1202 to a display 1216, such as a liquid crystal display (LCD) (or touch screen), for displaying information to a computer user. An input device 1218, including alphanumeric and other keys, is coupled to bus 1202 for communicating information and command selections to processor 1204. Another type of user input device is cursor control 1220, such as a mouse, a trackball, or cursor direction keys for communicating direction information and command selections to processor 1204 and for controlling cursor movement on display 1216. In some embodiments, the same direction information and command selections as cursor control may be implemented via receiving touches on a touch screen without a cursor.

The computing system 1200 may include a user interface module to implement a GUI that may be stored in a mass storage device as executable software codes that are executed by the computing device(s). This and other modules may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables.

In general, the word "component," "engine," "system," "database," data store," and the like, as used herein, can refer to logic embodied in hardware or firmware, or to a collection of software instructions, possibly having entry and exit points, written in a programming language, such as, for example, Java, C or C++. A software component may be compiled and linked into an executable program, installed in a dynamic link library, or may be written in an interpreted programming language such as, for example, BASIC, Perl, or Python. It will be appreciated that software components may be callable from other components or from themselves, and/or may be invoked in response to detected events or interrupts. Software components configured for execution on computing devices may be provided on a computer readable medium, such as a compact disc, digital video disc, flash drive, magnetic disc, or any other tangible medium, or as a digital download (and may be originally stored in a compressed or installable format that requires installation, decompression or decryption prior to execution). Such software code may be stored, partially or fully, on a memory device of the executing computing device, for execution by the computing device. Software instructions may be embedded in firmware, such as an EPROM. It will be further appreciated that hardware components may be comprised of connected logic units, such as gates and flip-flops, and/or may be comprised of programmable units, such as programmable gate arrays or processors.

The computer system 1200 may implement the techniques described herein using customized hard-wired logic, one or more ASICs or FPGAs, firmware and/or program logic which in combination with the computer system causes or programs computer system 1200 to be a special-purpose machine. According to one embodiment, the techniques herein are performed by computer system 1200 in response to processor(s) 1204 executing one or more sequences of one or more instructions contained in main memory 1206. Such instructions may be read into main memory 1206 from another storage medium, such as storage device 1210. Execution of the sequences of instructions contained in main memory 1206 causes processor(s) 1204 to perform the process steps described herein. In alternative embodiments, hard-wired circuitry may be used in place of or in combination with software instructions.

The term "non-transitory media," and similar terms such as machine-readable storage media, as used herein, refers to any media that store data and/or instructions that cause a machine to operate in a specific fashion. Such non-transitory media may comprise non-volatile media and/or volatile media. Non-volatile media includes, for example, optical or magnetic disks, such as storage device 1210. Volatile media includes dynamic memory, such as main memory 1206. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge, and networked versions of the same.

Non-transitory media is distinct from but may be used in conjunction with transmission media. Transmission media participates in transferring information between non-transitory media. For example, transmission media includes coaxial cables, copper wire and fiber optics, including the wires that comprise bus 1202. Transmission media can also take the form of acoustic or light waves, such as those generated during radio-wave and infra-red data communications.

The computer system 1200 also includes a communication interface 1222 coupled to bus 1202. Communication interface 1222 provides a two-way data communication coupling to one or more network links that are connected to one or more local networks. For example, communication interface 1222 may be an integrated services digital network (ISDN) card, cable modem, satellite modem, or a modem to provide a data communication connection to a corresponding type of telephone line. As another example, communication interface 1222 may be a local area network (LAN) card to provide a data communication connection to a compatible LAN (or WAN component to communicate with a WAN). Wireless links may also be implemented. In any such implementation, communication interface 1222 sends and receives electrical, electromagnetic or optical signals that carry digital data streams representing various types of information.

A network link typically provides data communication through one or more networks to other data devices. For example, a network link may provide a connection through local network to a host computer or to data equipment operated by an Internet Service Provider (ISP). The ISP in turn provides data communication services through the world wide packet data communication network now commonly referred to as the "Internet." Local network and Internet both use electrical, electromagnetic or optical signals that carry digital data streams. The signals through the various networks and the signals on network link and through communication interface 1222, which carry the digital data to and from computer system 1200, are example forms of transmission media.

The computer system 1200 can send messages and receive data, including program code, through the network (s), network link and communication interface 1222. In the Internet example, a server might transmit a requested code for an application program through the Internet, the ISP, the local network and the communication interface 1222.

The received code may be executed by processor 1204 as it is received, and/or stored in storage device 1210, or other non-volatile storage for later execution.

Each of the processes, methods, and algorithms described in the preceding sections may be embodied in, and fully or partially automated by, code components executed by one or more computer systems or computer processors comprising computer hardware. The one or more computer systems or computer processors may also operate to support performance of the relevant operations in a "cloud computing" environment or as a "software as a service" (SaaS). The processes and algorithms may be implemented partially or wholly in application-specific circuitry. The various features and processes described above may be used independently of one another, or may be combined in various ways. Different combinations and sub-combinations are intended to fall within the scope of this disclosure, and certain method or process blocks may be omitted in some implementations. The methods and processes described herein are also not limited to any particular sequence, and the blocks or states relating thereto can be performed in other sequences that are appropriate, or may be performed in parallel, or in some other manner. Blocks or states may be added to or removed from the disclosed example embodiments. The performance of certain of the operations or processes may be distributed among computer systems or computers processors, not only residing within a single machine, but deployed across a number of machines.

As used herein, a circuit might be implemented utilizing any form of hardware, software, or a combination thereof. For example, one or more processors, controllers, ASICs, PLAs, PALs, CPLDs, FPGAs, logical components, software routines or other mechanisms might be implemented to make up a circuit. In implementation, the various circuits described herein might be implemented as discrete circuits or the functions and features described can be shared in part or in total among one or more circuits. Even though various features or elements of functionality may be individually described or claimed as separate circuits, these features and functionality can be shared among one or more common circuits, and such description shall not require or imply that separate circuits are required to implement such features or functionality. Where a circuit is implemented in whole or in part using software, such software can be implemented to operate with a computing or processing system capable of carrying out the functionality described with respect thereto, such as computer system 1200.

As used herein, the term "or" may be construed in either an inclusive or exclusive sense. Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Terms and phrases used in this document, and variations thereof, unless otherwise expressly stated, should be construed as open ended as opposed to limiting. Adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

What is claimed is:

1. An analog content addressable memory (aCAM), comprising:
    an input data line;
    a match line; and
    a cell connected to the input data line and the match line, the cell comprising:
        a first tunable resistance device having a first conductance that establishes an upper voltage bound of a non-matching range of analog values; and
        a second tunable resistance device having a second conductance that establishes a lower voltage bound of the non-matching range of analog values,
    wherein a match line voltage observed on the match line indicates a match for an input data line voltage applied to the input data line that is above the upper voltage bound or below the lower voltage bound.

2. The aCAM of claim 1, wherein the cell further comprises:
    a first voltage divider circuit, comprising:
        the first tunable resistance device; and
        a first transistor in series with the first tunable resistance device; and
    a second voltage divider circuit, comprising:
        the second tunable resistance device; and
        a second transistor in series with the second tunable resistance device.

3. The aCAM of claim 2, further comprising a first select line and a second select line, wherein the first tunable resistance device and the second tunable resistance device are each connected to the first select line, and the first transistor and the second transistor are each connected to the second select line.

4. The aCAM of claim 2, the cell further comprising:
a first pull-down transistor connected to the match line; and
a second pull-down transistor connected to the match line in series with the first pull-down transistor,
wherein the first voltage divider circuit drives the first pull-down transistor and the second voltage divider circuit drives the second pull-down transistor.

5. The aCAM of claim 4, wherein the second voltage divider circuit further comprises an inverter configured to invert a voltage signal and apply the inverted voltage signal as a gate voltage to the second pull-down transistor.

6. The aCAM of claim 4, wherein the match line is pre-charged with the match line voltage, and wherein the aCAM detects the match if the match line is not discharged.

7. The aCAM of claim 6, wherein the match line is not discharged if least one of the first pull-down transistor or the second pull-down transistor is OFF.

8. The aCAM of claim 7, wherein, in response to the input data line voltage being above the upper voltage bound, the first voltage divider circuit applies a first gate voltage to the first pull-down transistor that is not sufficient to turn the first pull-down transistor ON.

9. The aCAM of claim 7, wherein, in response to the input data line voltage being below the lower voltage bound, the second voltage divider circuit applies a second gate voltage to the second pull-down transistor that is not sufficient to turn the second pull-down transistor ON.

10. The aCAM of claim 4, the cell further comprising:
a third voltage divider circuit comprising a third tunable resistance device; and
a third pull-down transistor driven by the third voltage divider circuit, wherein the third pull-down transistor is connected to the match line in parallel with the first pull-down transistor and the second pull-down transistor.

11. The aCAM of claim 10, wherein the aCAM is configured to search the input data line voltage with respect to multiple disjoint ranges of analog values.

12. The aCAM of claim 10, wherein the third voltage divider circuit has a same circuit structure as the second voltage divider circuit.

13. The aCAM of claim 2, the cell further comprising:
a first pass gate transistor connected to the match line; and
a second pass gate transistor connected to the match line,
wherein the first voltage divider circuit drives the first pass gate transistor and the second voltage divider circuit drives the second pass gate transistor.

14. The aCAM of claim 13, wherein the match line is charged with the match line voltage on a first side of the first and second pass gate transistors, and wherein the aCAM detects the match if the match line voltage is measurable on a second opposing side of the first and second pass gate transistors.

15. The aCAM of claim 14, wherein the match line voltage is measurable on the second opposing side of the first and second pass gate transistors if least one of the first pass gate transistor or the second pass gate transistor is ON to provide an unbroken path for the match line voltage through the pass gate transistors.

16. The aCAM of claim 15, wherein, in response to the input data line voltage being above the upper voltage bound, the first voltage divider circuit applies a first gate voltage to the first pass gate transistor that is sufficient to turn the first pass gate transistor ON, and wherein, in response to the input data line voltage being below the lower voltage bound, the second voltage divider circuit applies a second gate voltage to the second pass gate transistor that is sufficient to turn the second pass gate transistor ON.

17. The aCAM of claim 13, the cell further comprising:
a third voltage divider circuit comprising a third tunable resistance device; and
a third pass gate transistor connected to the match line,
wherein the third pass transistor is driven by the third voltage divider circuit, and
wherein the third voltage divider circuit has a same circuit structure as the first voltage divider circuit.

18. The aCAM of claim 1, wherein the first and second tunable resistance devices are memristors or three-terminal semiconductor devices.

* * * * *